(12) United States Patent
Yu et al.

(10) Patent No.: US 12,224,276 B2
(45) Date of Patent: Feb. 11, 2025

(54) 3D SEMICONDUCTOR PACKAGES

(71) Applicant: Taiwan Semiconductor Manufacturing Company, Ltd., Hsinchu (TW)

(72) Inventors: Chen-Hua Yu, Hsinchu (TW); Chun-Hui Yu, Hsinchu County (TW); Kuo-Chung Yee, Taoyuan (TW); Liang-Ju Yen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 19 days.

(21) Appl. No.: 17/837,039

(22) Filed: Jun. 10, 2022

(65) Prior Publication Data

US 2022/0302100 A1    Sep. 22, 2022

Related U.S. Application Data

(63) Continuation of application No. 16/888,874, filed on Jun. 1, 2020, now Pat. No. 11,393,805.
(Continued)

(51) Int. Cl.
*H01L 25/18*    (2023.01)
*H01L 23/31*    (2006.01)
(Continued)

(52) U.S. Cl.
CPC .......... *H01L 25/18* (2013.01); *H01L 23/3135* (2013.01); *H01L 23/367* (2013.01); *H01L 23/5383* (2013.01); *H01L 25/50* (2013.01)

(58) Field of Classification Search
CPC ... H01L 25/18; H01L 23/3135; H01L 23/367; H01L 23/5383; H01L 25/50; H01L 2224/0401; H01L 2224/04105; H01L 2224/0557; H01L 2224/13025; H01L 2224/16145; H01L 2224/16227; H01L 2224/16235; H01L 2224/17181; H01L 2224/73259; H01L 2224/92124; H01L 21/561; H01L 24/19; H01L 24/20; H01L 25/0652; H01L 25/105; H01L 21/568; H01L 23/3128; H01L 2221/68345; H01L 2221/68359; H01L 2221/68372; H01L 2221/68381; H01L 2224/06181; H01L 2224/12105; H01L 2224/16146; H01L 2224/214; H01L 2224/2518; H01L 2224/32137; H01L 2225/1047; H01L 21/486; H01L 23/49811; H01L 23/5385;
(Continued)

(56) References Cited

U.S. PATENT DOCUMENTS 9,607,967 B1 *  3/2017  Shih ................... H01L 21/6835
2015/0357307 A1 * 12/2015  Fu ....................... H01L 23/5384
                                                              257/774
2019/0131241 A1 *  5/2019  Jeng ..................... H01L 25/105

* cited by examiner

*Primary Examiner* — Kyoung Lee
*Assistant Examiner* — Christina A Sylvia
(74) *Attorney, Agent, or Firm* — JCIPRNET

(57) ABSTRACT

A semiconductor package includes a first die, a first heat conduction block and a first encapsulant. The first die has a bottom surface, a top surface and a sidewall between the bottom surface and the top surface. The first heat conduction block has a bottom surface, a top surface and a sidewall between the bottom surface and the top surface. The first encapsulant is disposed between the sidewall of the first die and the sidewall of the first heat conduction block.

20 Claims, 36 Drawing Sheets

Related U.S. Application Data

(60) Provisional application No. 62/893,794, filed on Aug. 29, 2019.

(51) Int. Cl.
*H01L 23/367* (2006.01)
*H01L 23/538* (2006.01)
*H01L 25/00* (2006.01)

(58) Field of Classification Search
CPC ........... H01L 23/5389; H01L 23/49816; H01L 2224/32145; H01L 2224/32225; H01L 2224/32245; H01L 2224/73204; H01L 2224/73209; H01L 2224/73267; H01L 2224/81005; H01L 2224/81193; H01L 2224/83005; H01L 2224/92244; H01L 2225/06513; H01L 2225/06517; H01L 2225/06541; H01L 2225/06548; H01L 2225/06589; H01L 2924/15192; H01L 2924/18161; H01L 23/4334; H01L 21/6835; H01L 23/3114
See application file for complete search history.

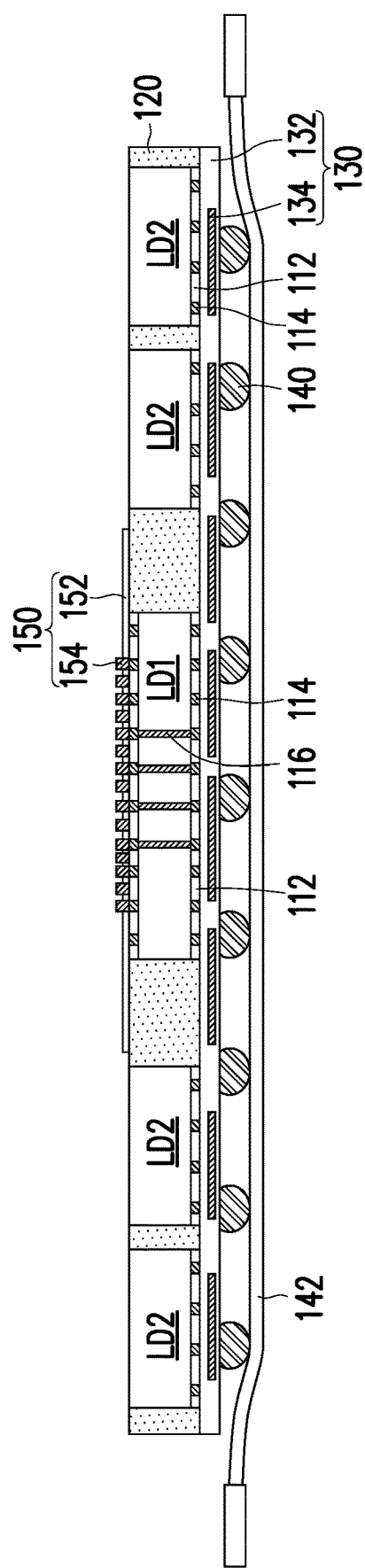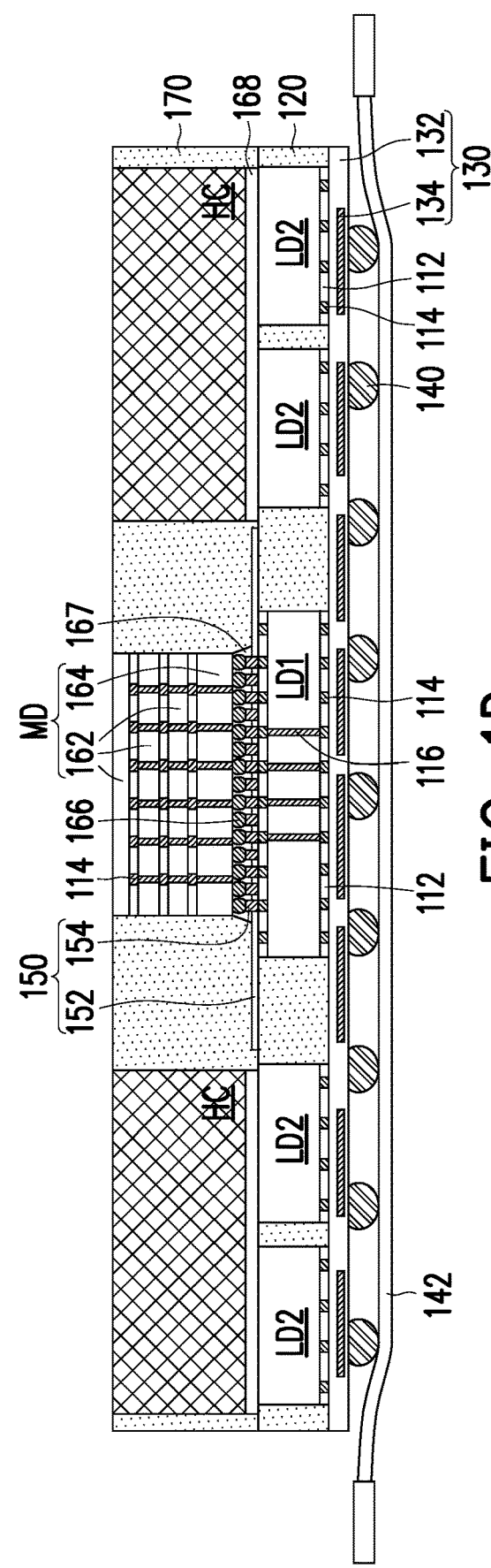

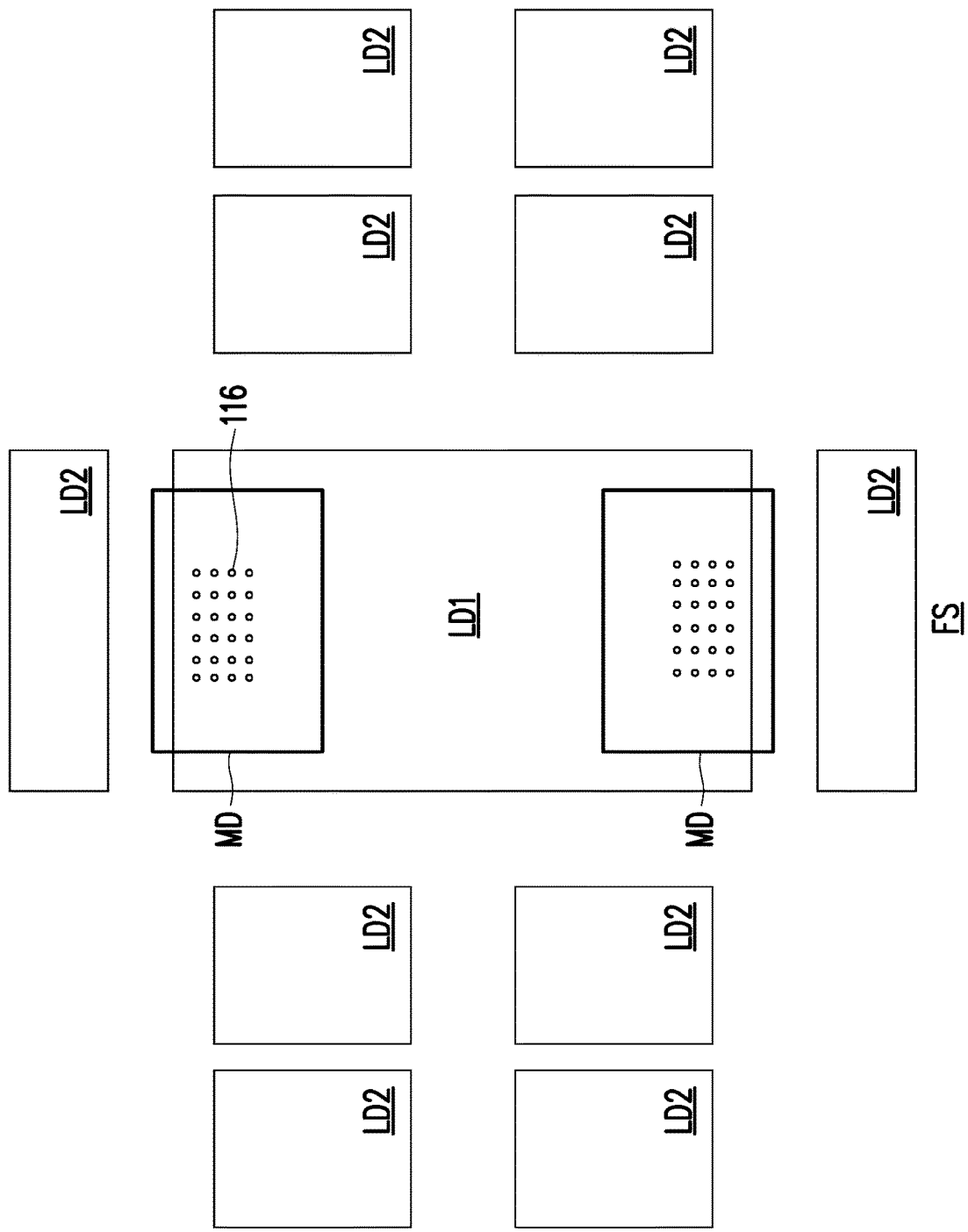

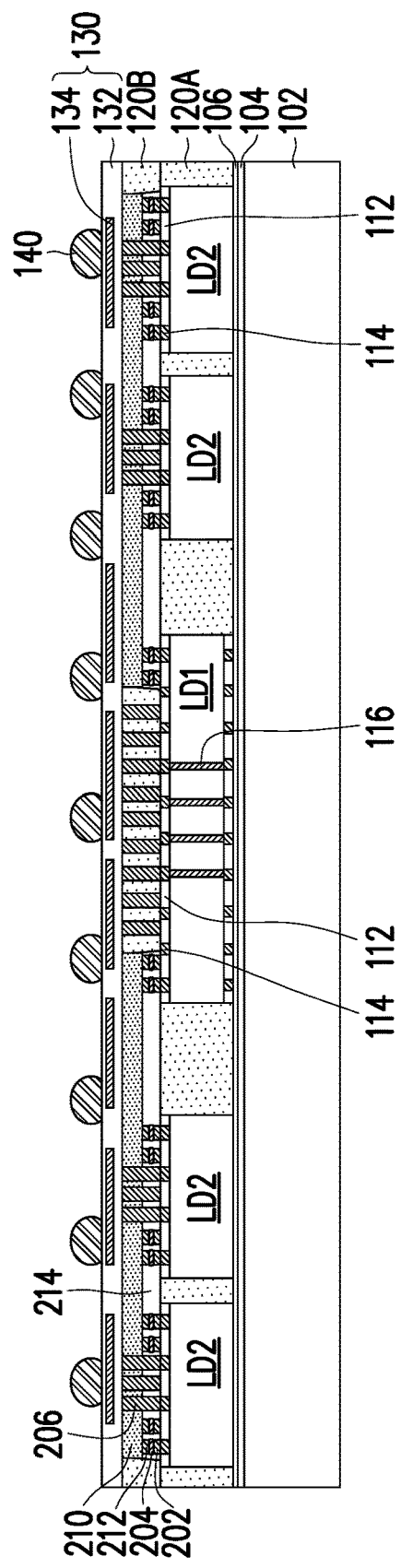
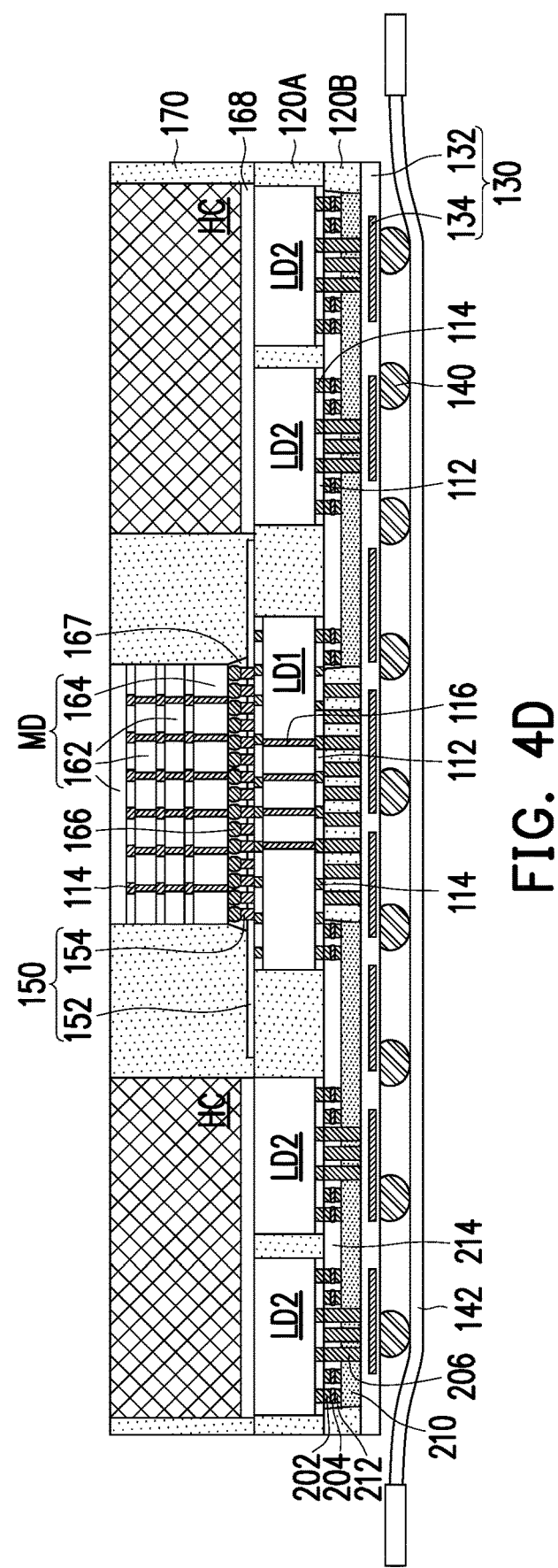
FIG. 4C
FIG. 4D

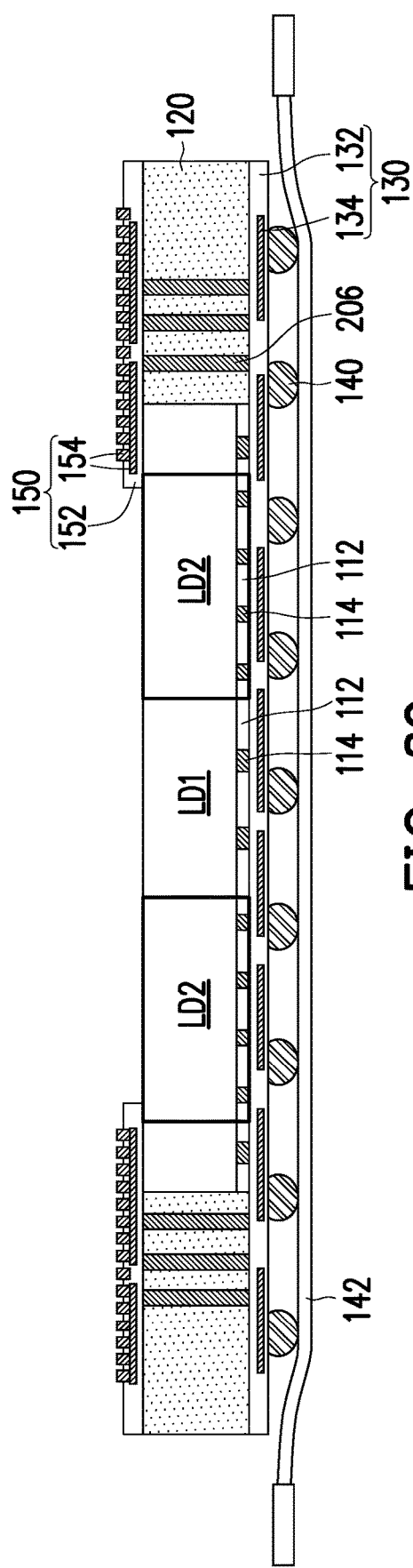
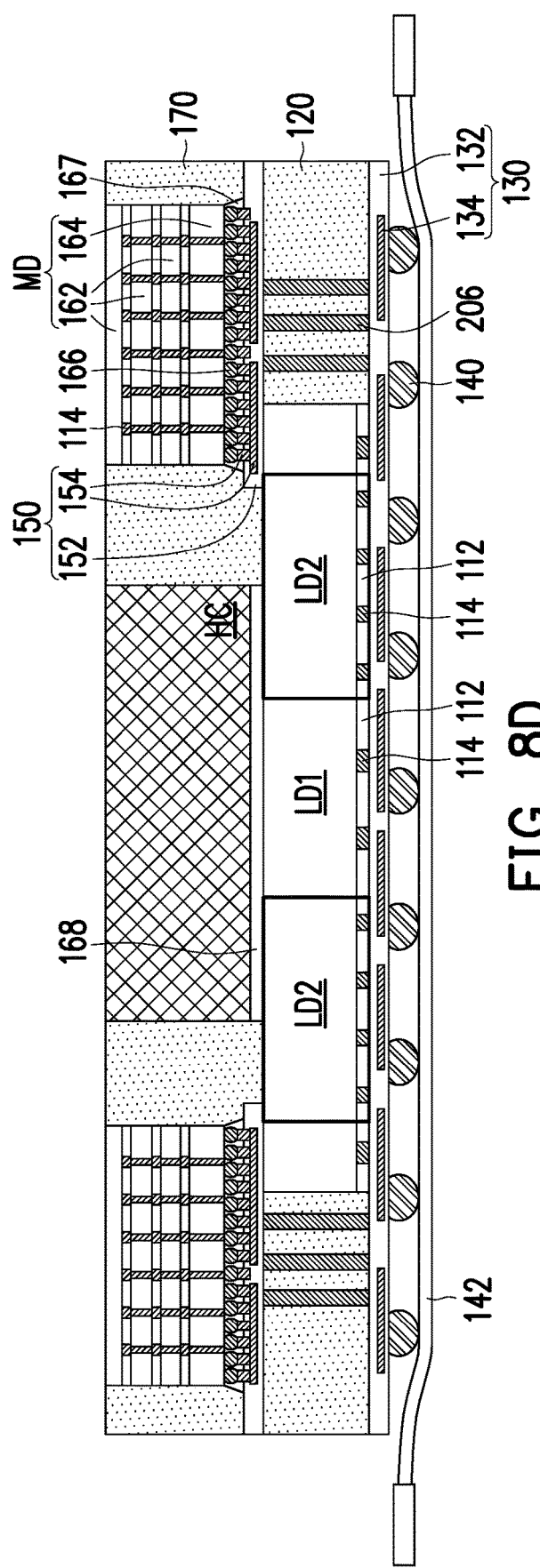
FIG. 8C
FIG. 8D

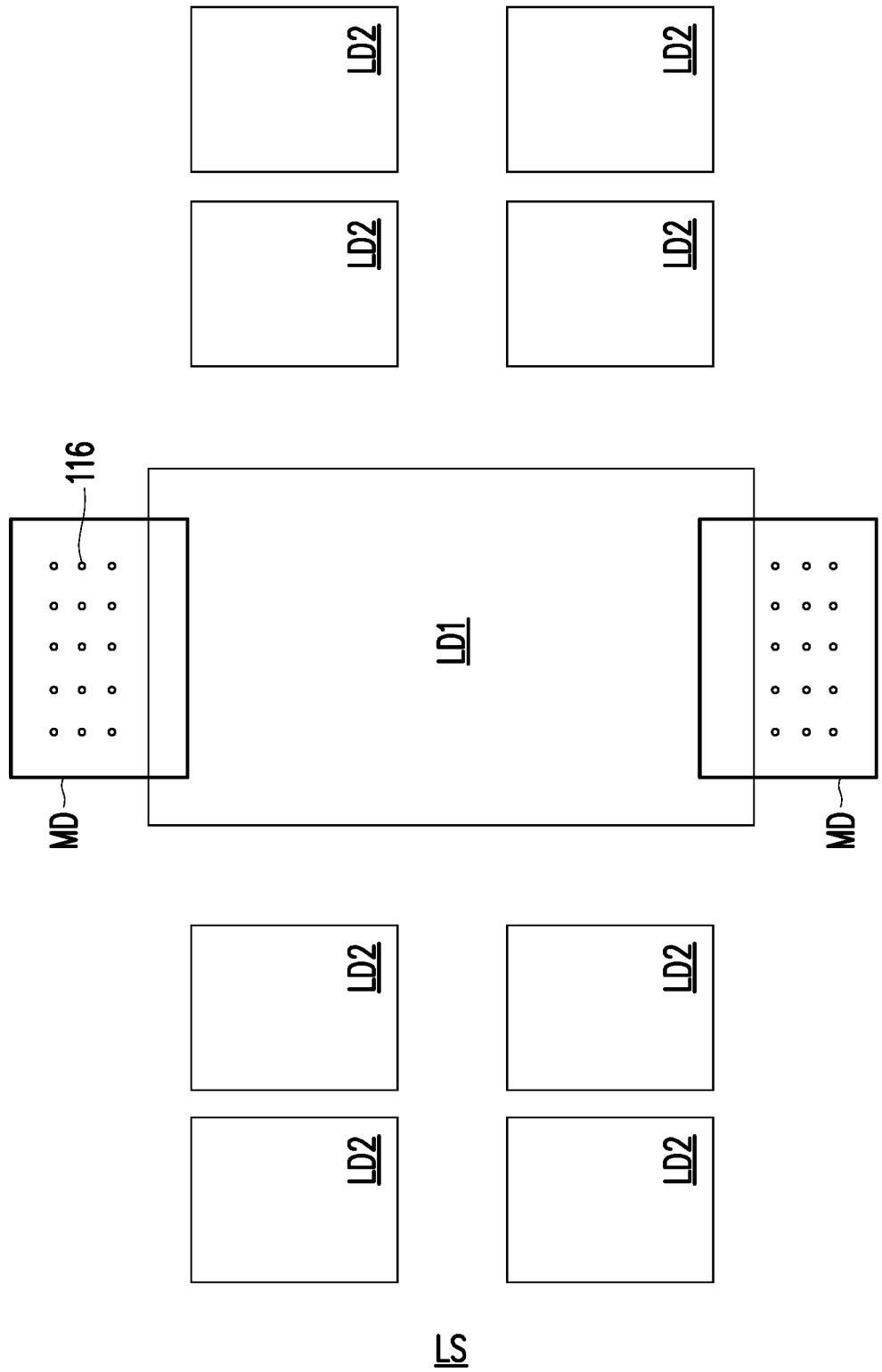

3D SEMICONDUCTOR PACKAGES

CROSS-REFERENCE TO RELATED APPLICATION

This application is a continuation application of and claims the priority benefit of a prior application Ser. No. 16/888,874, filed on Jun. 1, 2020 and now allowed, which claims the priority benefit of U.S. provisional application Ser. No. 62/893,794, filed on Aug. 29, 2019. The entirety of the above-mentioned patent applications is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, communication between the dies has become a more challenging issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1E are front views of a method of forming a semiconductor package in accordance with some embodiments.

FIG. 2 is a top view of a semiconductor package.

FIG. 4A to FIG. 4E are front views of a method of forming a semiconductor package in accordance with some embodiments.

FIG. 8A to FIG. 8E are lateral views of a method of forming a semiconductor package in accordance with some embodiments.

FIG. 9 is a top view of a semiconductor package.

DETAILED DESCRIPTION

Figure 1A:
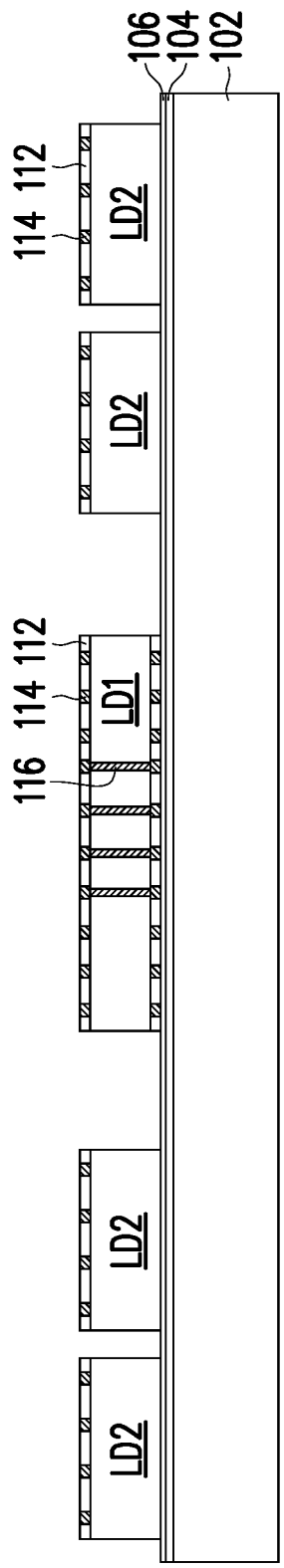

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good semiconductor devices to increase the yield and decrease costs.

FIG. 1A to FIG. 1E are front views of a method of forming a semiconductor package in accordance with some embodiments. FIG. 2 is a top view of a semiconductor package.

FIG. 1A to FIG. 1E are viewed from a front side FS of the semiconductor package of FIG. 2, and a second logic die at the front side is omitted in FIG. 1A to FIG. 1E for clarity.

Referring to FIG. 1A, a carrier 102 with a de-bonding layer 104 coated thereon is provided. In some embodiments, the carrier 102 may be a glass carrier, a ceramic carrier, a metal carrier or any other carrier suitable for carrying a semiconductor wafer or a reconstituted wafer for the manufacturing method of the semiconductor package. The de-bonding layer 104 includes, for example, a light-to-heat conversion ("LTHC") layer, and such layer enables debonding from the carrier by applying laser irradiation. In some alternative embodiments, the de-bonding layer 104 may be any other material suitable for bonding and debonding the carrier 102 from the above layers or wafer disposed thereon. In some alternative embodiments, a buffer layer may be formed between the de-bonding layer 104 and the carrier 102. In addition, a dielectric layer (not shown) may be formed over the de-bonding layer 104. The dielectric layer may be polymer such as polyimide, benzocyclobutene ("BCB") and polybenzoxazole ("PBO"), non-organic dielectric materials such as silicon oxide, silicon nitride, silicon carbide, silicon oxynitride, or the like. However, the materials of the carrier 102, the de-bonding layer 104 and the dielectric layer are merely for illustration, and the disclosure is not limited thereto.

Then, a first logic die LD1 and a plurality of second logic dies LD2 are disposed over the carrier 102. For example, the first logic die LD1 and the second logic dies LD2 are picked and placed onto the de-bonding layer 104. In some embodiments, a die attach film 106 is located between the first logic die LD1 and the de-bonding layer 104 and between the second logic dies LD2 and the de-bonding layer 104 for adhering the first logic die LD1 and the second logic dies LD2 onto the de-bonding layer 104. In some embodiments, as shown in FIGS. 1A and 2, the first logic die LD1 is surrounded by the second logic dies LD2. For example, the second logic dies LD2 are respectively disposed at one side of the first logic die LD1. In some embodiments, the first logic die LD1 and the second logic dies LD2 are disposed at the same level and are collectively referred to as the first layer.

In some embodiments, the first logic die LD1 is different from the second logic dies LD2. The first logic die LD1 may be an I/O die, an application-specific integrated circuit (ASIC) die, a field programmable gate array (FPGA), or the like. The second logic dies LD2 may be respectively a central processing unit (CPU) die, a graphics processing unit (CPU) die, a general processing unit (GPU) die, an artificial intelligence (AI) engine die, a Transceiver (TRX) die, or the like. In some embodiments, the first logic die LD1 is an I/O die. The second logic dies LD2 at one opposite sides (e.g., first and second sides such as lateral sides) of the first logic die LD1 may be the same dies such as CPU/GPU chiplets/cores. The second logic dies LD2 at the other opposite sides (e.g., third and fourth sides such as front side and back side) of the first logic die LD1 may be different dies such as an AI engine die and a Transceiver (TRX) die. However, the disclosure is not limited thereto.

In some embodiments, the first logic die LD1 and the second logic dies LD2 have a dielectric layer 112 thereon and a plurality of connectors 114 in the dielectric layer 112. In some embodiments, as shown in FIG. 1A, the first logic die LD1 include the connectors 114 at opposite surfaces and a plurality of through vias 116 electrically connecting the connectors 114 at the opposite surfaces. In some embodiments, the dielectric layer 112 includes organic materials such as polybenzoxazole (PBO) and polyimide (PI) or inorganic materials. The connectors 114 may be vias, pads, pillars or other suitable connectors. However, the structure of the first logic die LD1 and the second logic dies LD2 are merely for illustration, and the disclosure is not limited thereto. The through vias 116 are also referred to as through semiconductor vias or through silicon vias, for example. In some embodiments, as shown in FIG. 2, the first logic die LD1 further includes a PHY (physical) layer and a plurality of ports (not shown) for data transportation of the first logic die LD1 and the second logic dies LD2. The ports may be IFIS ports, PCIe ports and/or SATA ports.

Figure 1B:
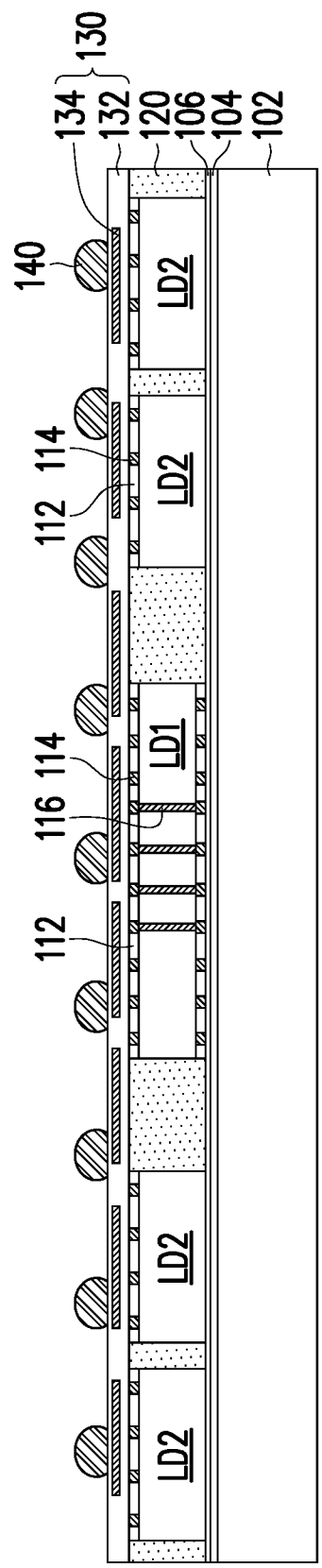

Referring to FIG. 1B, an encapsulant 120 is formed to encapsulate the first logic die LD1 and the second logic dies LD2. The encapsulant 120 is formed around the first logic die LD1 and the second logic dies LD2 and fills the gap between the first logic die LD1 and the second logic dies LD2. In some embodiments, the encapsulant 120 includes a molding compound, a resin, or the like. In some alternative embodiments, the encapsulant 120 includes silicon oxide, silicon nitride, a polymer material such as polybenzoxazole (PBO), polyimide, benzocyclobutene (BCB), a combination thereof, or the like. In some embodiments, the encapsulant 120 is molded, and then grinded by a grinding process until a top surface of the encapsulant 120 is substantially flush with top surfaces of the first logic die LD1 and the second logic dies LD2. In some alternative embodiments, the dielectric layer 112 and/or the connectors 114 may be also partially removed by the grinding process.

Then, a redistribution layer structure 130 is formed over the encapsulant 120 and electrically connected to the first logic die LD1 and the second logic dies LD2. The redistribution layer structure 130 includes a dielectric layer 132 and conductive features 134 in the dielectric layer 132. The conductive features 134 are electrically connected to the connectors 114 of the first logic die LD1 and the second logic dies LD2. In some embodiments, the dielectric layer 132 includes polybenzoxazole (PBO), polyimide (PI), benzocyclobutene (BCB), silicon oxide, silicon nitride, a combination thereof, or the like. In some embodiments, the conductive features 134 are conductive lines and/or conductive vias. In some embodiments, the conductive features 134 include Cu, Ti, Ta, W, Ru, Co, Ni, a combination thereof, or the like. In some alternative embodiments, a seed layer and/or a barrier layer is disposed between the metal feature 134 and the dielectric layer 132. The seed layer includes, for example, Ti/Cu. The barrier layer may include Ta, TaN, Ti, TiN, CoW or a combination thereof.

After that, a plurality of conductive terminals 140 are formed over and electrically connected to the redistribution layer structure 130. The conductive terminals 140 may include solder material including alloys of tin, lead, silver, copper, nickel, bismuth, or combinations thereof. In some embodiments, the conductive terminals 140 include controlled collapse die connection (C4) bumps, micro-bumps, electroless nickel-electroless palladium-immersion gold technique (ENEPIG) formed bumps, ball grid array (BGA), conductive pillars, combination thereof, or the like. In some embodiments, the conductive terminals 140 are electrically connected to the first logic die LD1 and the second logic dies LD2 through the redistribution layer structure 130.

Referring to FIG. 1C, the die attach film 106 is de-bonded from the de-bonding layer 104, such that the structure over the de-bonding layer 104 is separated from the carrier 102. That is, the carrier 102 is removed. In some embodiments, the de-bonding layer 104 (e.g., the LTHC release layer) may be irradiated by an UV laser such that the die attach film 106 adhered on the de-bonding layer 104 is peeled from the carrier 102. Then, the formed structure is turned upside down and disposed on a carrier 142. After that, the die attach film 106 is removed. In some embodiments, after removing the die attach film 106, a planarization process may be performed onto the structure of FIG. 1C.

Then, a redistribution layer structure 150 is formed over the encapsulant 120 to electrically connect to the first logic die LD1. In some embodiments, the redistribution layer structure 150 may include a dielectric layer 152 and conductive features 154 in the dielectric layer 152. The dielectric layer 152 covers a top surface of the first logic die LD1 and a portion of the encapsulant 120. In some embodiments, the dielectric layer 152 exposes top surfaces of the second logic dies LD2. The conductive features 154 are disposed in the dielectric layer 152 and electrically connected to the connectors 114 of the first logic die LD1. In some embodiments, the conductive features 154 are protruded from the dielectric layer 152, in other words, top surfaces of the conductive features 154 are exposed. In some embodiments, the conductive features 154 are micro-bumps, for example.

Referring to FIGS. 1D and 2, a plurality of memory dies MD are disposed on and electrically connected to the first logic die LD1. In some embodiments, the memory dies MD are electrically connected to the first logic die LD1 through the redistribution layer structure 150. In some embodiments, the memory die MD may be a die such as a dynamic random-access memory (DRAM) and a synchronous dynamic random-access memory (SDRAM) or a die stack such as a high bandwidth memory (HBM) cube. In some embodiments, the memory die MD includes a plurality of dies 162 and a controller die 164 under the dies 162. For example, the dies 162 are DRAM dies and the dies 162 are electrically connected to each other by connectors 114 therebelow. The controller die 164 may be an HBM controller die. In some embodiments, there are through silicon vias in the dies 162, 164. However, the disclosure is not limited thereto. In some embodiments, the memory dies MD are partially overlapped with the first logic die LD1 therebeneath. In some embodiments, a shortest connecting distance is formed between the controller die 164 and the PHY layer of the first logic die LD1. In some embodiments, the memory die MD has a plurality of connectors 166 therebeneath. In some embodiments, the connectors 166 of the memory die MD are electrically connected to the conductive features 154 of the redistribution layer structure 150, and an underfill 167 is formed aside the connectors 166 and the conductive features 154. It is noted that the memory die MD described above are for the purpose of illustration, however, the disclosure is not intended to limit thereto.

Figure 1E:
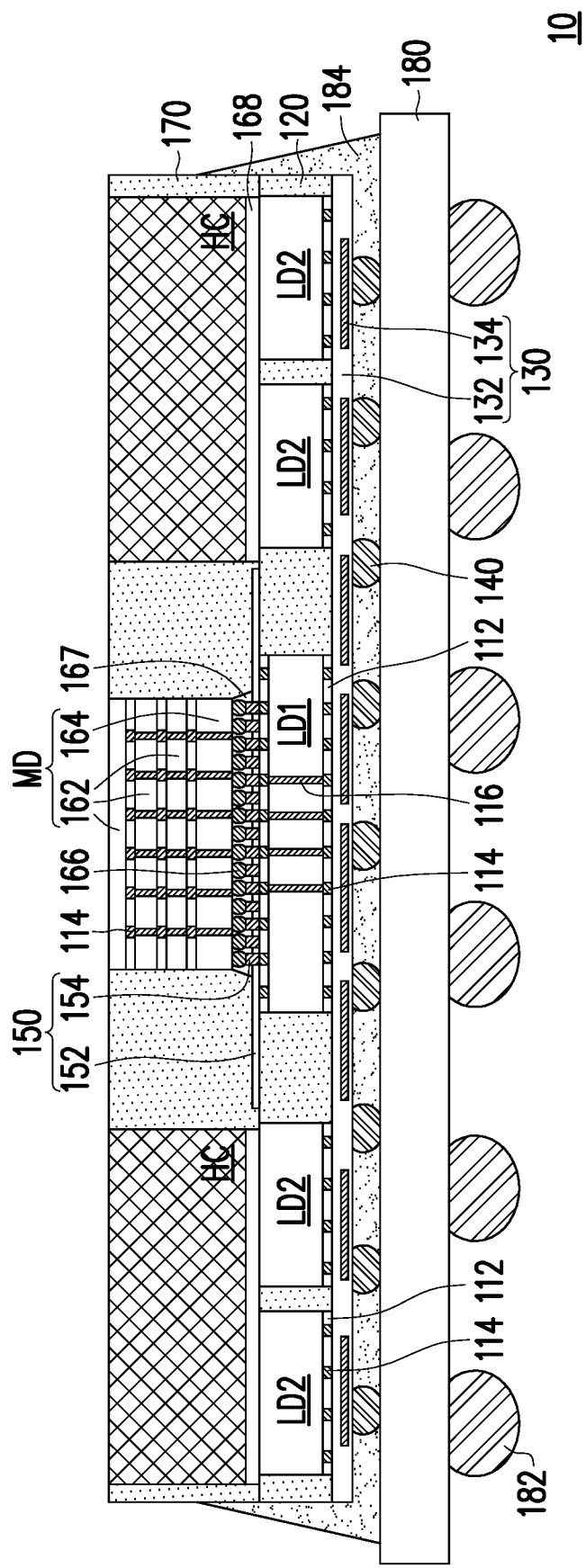

Then, a heat conduction block HC is picked and placed onto at least one of the second logic dies LD2. For example, the heat conduction block HC is picked and placed onto top surfaces of the second logic dies LD2. In some embodiments, the heat conduction block HC is disposed over the second logic dies LD2 which are disposed at the same side of the first logic die LD1. In other words, the heat conduction block HC may continuously cover two or more second logic dies LD2. For example, as shown in FIG. 1D, one heat conduction block HC is disposed over two second logic dies LD2 which are disposed at a first lateral side of the first logic die LD1, and another heat conduction block HC is disposed over another two second logic dies LD2 which are disposed at a second lateral side of the first logic die LD1. However, the disclosure is not limited thereto. In some alternative embodiments, the heat conduction block HC may be disposed on one second logic die LD2, respectively. In some embodiments, the heat conduction block HC includes thermal conductivity larger than an encapsulant 170 (shown in FIG. 1D). In some embodiments, the heat conduction block HC includes thermal conductivity substantially equal to or larger than silicon. In some embodiments, the heat conduction block HC may include a semiconductor material such as silicon, a conductive material such as copper, an insulating material, a combination thereof, or the like. In some embodiments, the heat conduction block HC may be free of active device and passive device and may not provide addition electrical functionality to a semiconductor package 10 (as shown in FIG. 1E). In some embodiments, the heat conduction block HC may be configured as a heat dissipation feature that transfers heat away from the integrated dies such as the first logic die LD1, the second logic dies LD2 and the memory dies MD. In some embodiments, the heat conduction block HC is also referred to as a heat dissipation block. In addition, a size of the heat conduction block HC may be adjusted according to the requirements. In some embodiments, the memory dies MD and the heat conduction blocks HC are disposed at the same level and are collectively referred to as the second layer.

In some embodiments, the heat conduction block HC is disposed onto the second logic die LD2 through a thermally conductive adhesive 168 such as a die attach film (DAF) having high thermal conductivity, a polymer-based layer, a graphite film and a solder layer. That is, the thermally conductive adhesive 168 is disposed between the heat conduction block HC and the second logic die LD2. In some embodiments, the thermally conductive adhesive 168 is in direct contact with the heat conduction block HC and the second logic die LD2. In some embodiments, a sidewall of the heat conduction block HC is substantially flush with a sidewall of the thermally conductive adhesive 168. However, the disclosure is not limited thereto.

Then, an encapsulant 170 is formed to encapsulate the memory dies MD and the heat conduction blocks HC. The encapsulant 170 is formed around the memory dies MD and the heat conduction blocks HC and fills the gap between the memory dies MD and the heat conduction blocks HC. In some embodiments, the encapsulant 170 includes a molding compound, a resin, or the like. In some alternative embodiments, the encapsulant 170 includes silicon oxide, silicon nitride, a polymer material such as polybenzoxazole (PBO), polyimide, benzocyclobutene (BCB), a combination thereof, or the like. In some embodiments, the encapsulant 170 is molded and grinded until a top surface of the encapsulant 170 is substantially flush with top surfaces of the memory dies MD and the heat conduction blocks HC. After forming the encapsulant 170, a package structure is formed over the carrier 142.

Referring to FIG. 1E, the package structure is de-bonded from the carrier 142. Then, the package structure is bonded onto a substrate 180. In some alternative embodiments, before bonding to the substrate 180, a singulation process may be performed to form a single package structure. In some embodiments, the conductive terminals 140 of the package structure are bonded to a first surface of the substrate 180 to electrically connect the substrate 180. In addition, a plurality of terminal connectors 182 are disposed on a second surface opposite to the first surface of the substrate 180. The first logic die LD1 and the second logic dies LD2 may be electrically connected to the substrate 180 through the conductive terminals 140 and the redistribution layer structure 130. In some embodiments, the through vias 116 electrically connects the redistribution layer structure 130 and the redistribution layer structure 150, and thus the memory dies MD may be electrically connected to the substrate 180 through the redistribution layer structure 150, the through vias 116 of the first logic die LD1 and the redistribution layer structure 130. In some embodiments, the substrate 180 is a printed circuit board, for example. Then, an underfill 184 is formed aside the terminal connectors 140 between the redistribution layer structure 130 of the package structure and the substrate 180. In some embodiments, a portion of a sidewall of the package structure is covered by the underfill 184. Then, the semiconductor package 10 is formed. In some embodiments, the semiconductor package 10 includes the first layer and the second layer over the first layer, the first layer includes the first logic die LD1 and the second logic dies LD2 encapsulated by the encapsulant 120, and the second layer includes the memory dies MD and the heat conduction blocks HC encapsulated by the encapsulant 170.

Figure 3:
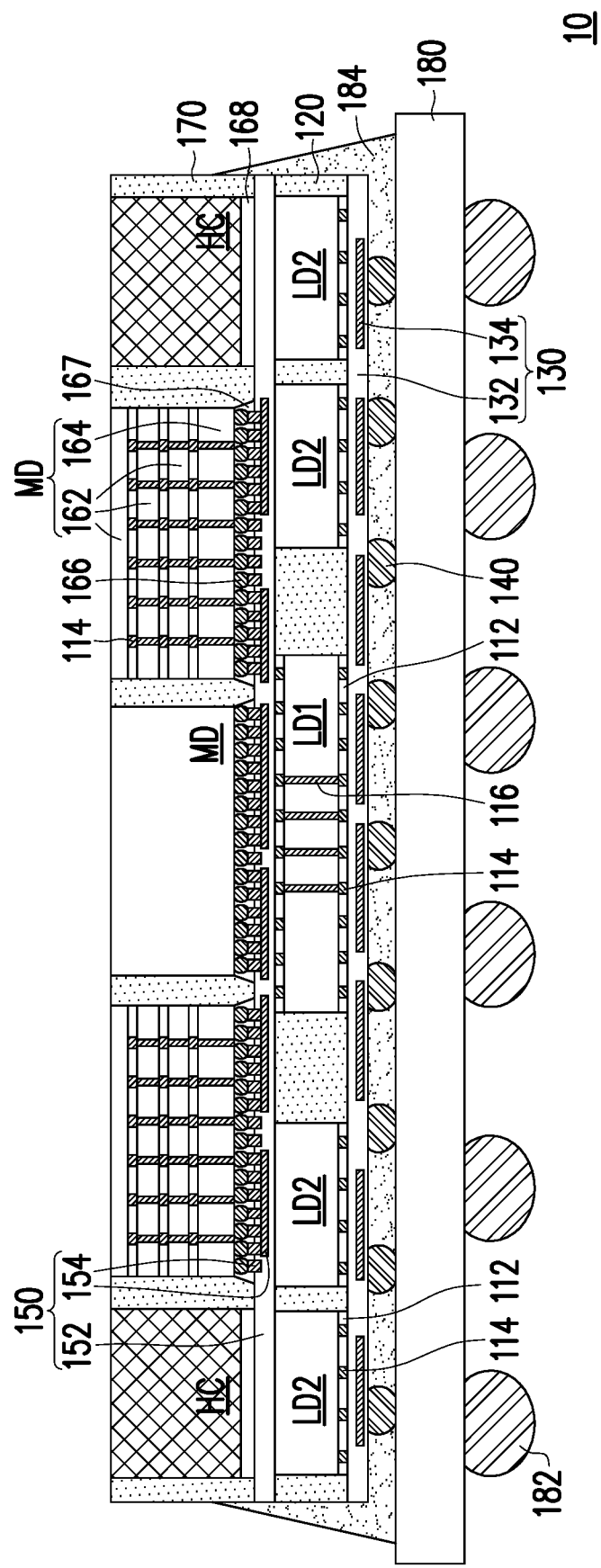
FIG. 3 is a front view of a semiconductor package in accordance with some embodiments.

FIG. 3 is a front view of a semiconductor package in accordance with some embodiments. The semiconductor package of FIG. 3 may be similar to the semiconductor package of FIG. 1E, and main difference lies in the second layer. Thus, the same reference numerals are used to refer to the same and liked parts, and its detailed description will be omitted herein. The difference is illustrated in details below.

Referring to FIG. 3, a semiconductor package 10 includes a substrate 180, redistribution layer structures 130 and 150, a first layer including a first logic die LD1 and a plurality of second logic dies LD2 and a second layer including a plurality of memory dies MD and a plurality of heat conduction blocks HC. The first layer is similar to the first layer of the semiconductor package 10 of FIG. 1E, and thus the details are omitted. For example, the first logic die LD1 and the second logic dies LD2 surrounding the first logic die LD1 are disposed at the same level and encapsulated by an encapsulant 120.

The second layer is disposed over the first layer. In some embodiments, the memory dies MD and the heat conduction blocks HC aside the memory dies MD are disposed at the same level and encapsulated by an encapsulant 170. In some embodiments, the memory dies MD are disposed over the first logic die LD1 and the second logic dies LD2. For example, the memory die MD (i.e., inner memory die) such as SDRAM is disposed over the first logic die LD1, and the memory dies MD (i.e., outer memory dies) including a plurality of dies 162 and a controller die 164 are disposed aside the memory die MD over the second logic dies LD2. The memory dies MD are electrically connected to the first logic die LD1 and the second logic dies LD2 through the redistribution layer structure 150. In some embodiments, the redistribution layer structure 150 may entirely cover the encapsulant 120, the first logic die LD1 and the second logic dies LD2. The heat conduction blocks HC are disposed at opposite sides of the memory dies MD over the second logic dies LD2. In some embodiments, the heat conduction blocks HC are adhered to the dielectric layer 152 through thermally conductive adhesives 168 respectively.

FIG. 4A to FIG. 4E are front views of a method of forming a semiconductor package in accordance with some embodiments. FIG. 5 is a top view of a semiconductor package. FIG. 4A to FIG. 4E are viewed from a front side FS of the semiconductor package of FIG. 5. The method of FIG. 4A to FIG. 4E may be similar to the method of FIG. 1A to FIG. 1E, and thus the same reference numerals are used to refer to the same and liked parts, and its detailed description will be omitted herein. The difference is illustrated in details below.

Figure 4A:
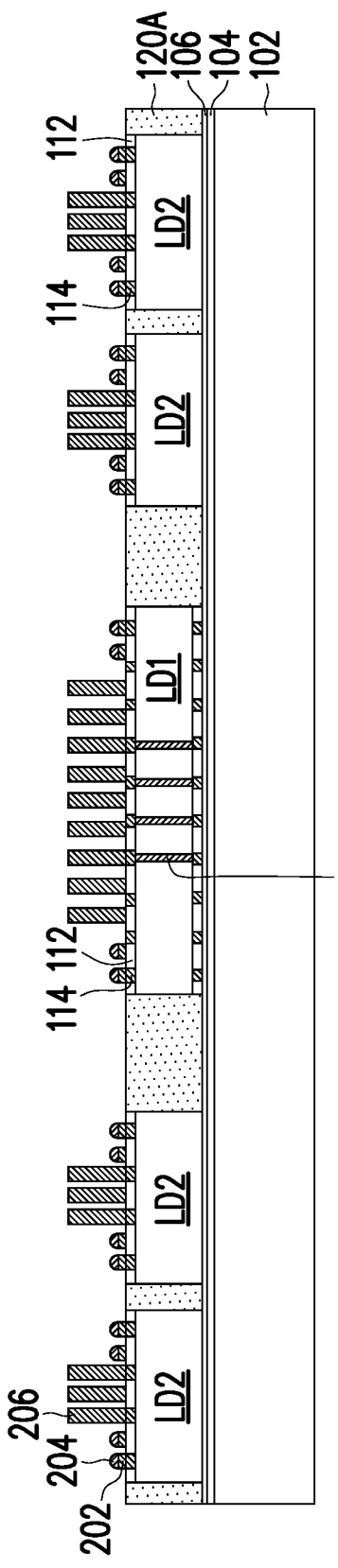
Figure 5:
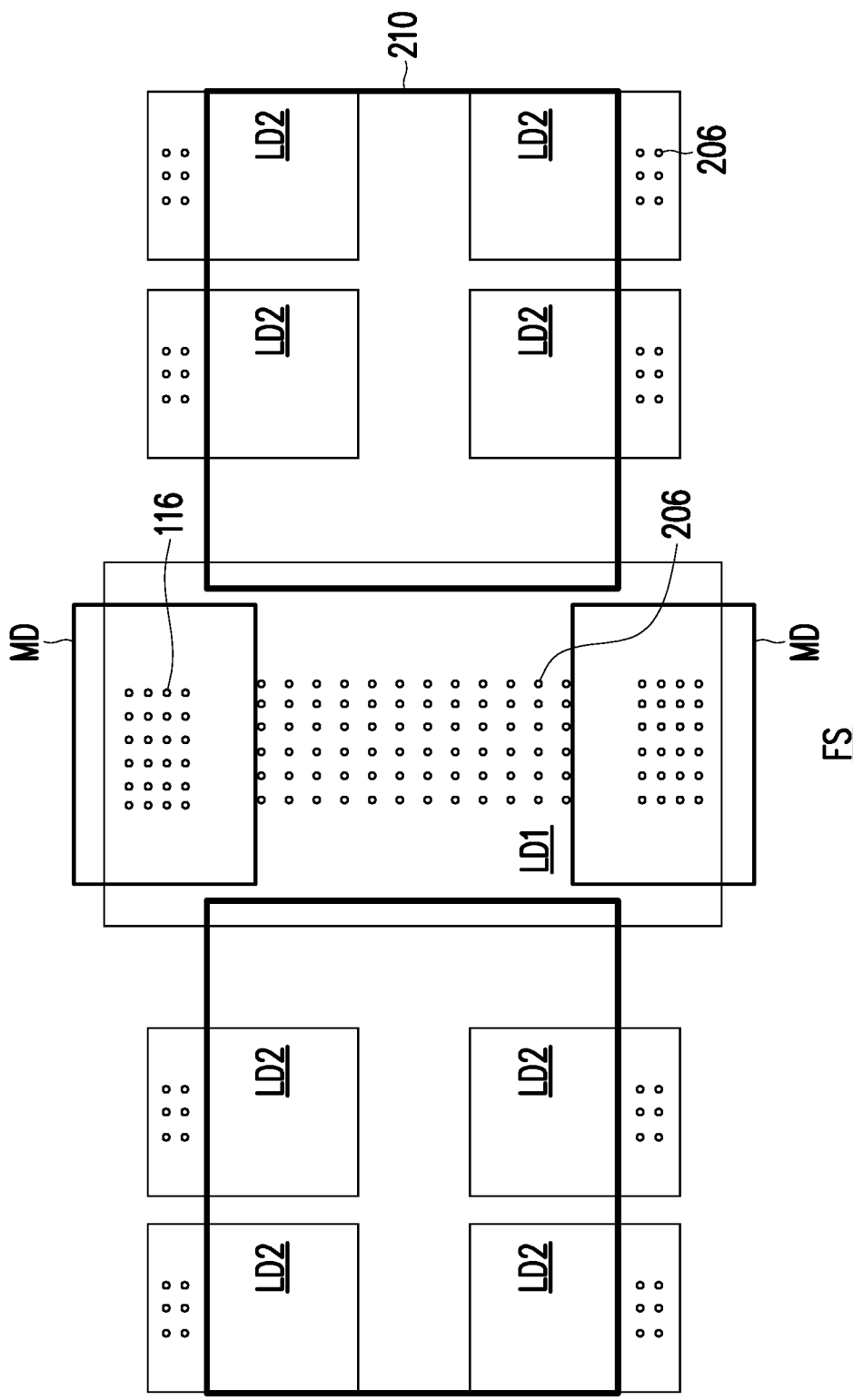
FIG. 5 is a top view of a semiconductor package.

Referring to FIG. 4A, a first logic die LD1 and a plurality of second logic dies LD2 are disposed on a de-bonding layer 104 over a carrier 102. In some embodiments, the first logic die LD1 and the second logic dies LD2 may be picked and placed onto the de-bonding layer 104 through a die attach film 106. The first logic die LD1 and the second logic dies LD2 may have a dielectric layer 112 thereover and a plurality of connectors 114 in the dielectric layer 112. Then, an encapsulant 120A is formed to encapsulate the first logic die LD1 and the second logic dies LD2. After that, a plurality of conductive features 202 are formed on and electrically connected the first logic die LD1 and the second logic dies LD2. In some embodiments, the conductive features 202 are disposed on and electrically connected to the connectors 114 in an outer region of the first logic die LD1 and the second logic dies LD2. In some embodiments, the conductive features 202 are micro-bumps, for example. In addition, a plurality of solder layers 204 are respectively formed over the conductive features 202.

Then, a plurality of conductive pillars 206 are formed on and electrically connected to the connectors 114 of the first logic die LD1 and the second logic dies LD2. In some embodiments, the conductive pillars 206 are disposed on and electrically connected to the connectors 114 in an inner region of the first logic die LD1 and the second logic dies LD2. For example, the conductive pillars 206 are disposed between the conductive features 202.

Figure 4B:
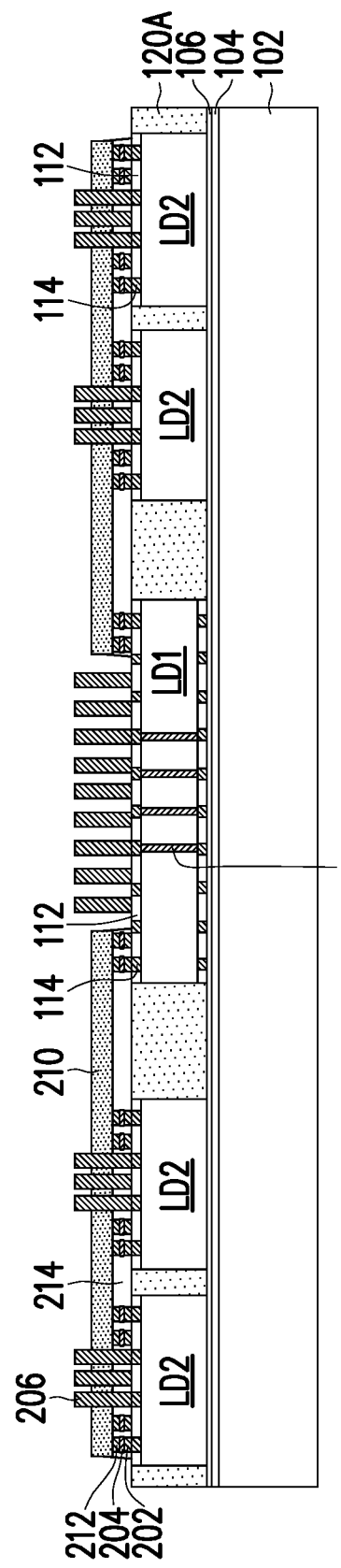

Referring to FIGS. 4B and 5, a plurality of bridges 210 are bonded onto the first logic die LD1 and the second logic dies LD2, so as to electrically connect the first logic die LD1 and the second logic dies LD2. In some embodiments, the bridge 210 has a plurality of connectors 212 thereon, and the bridge 210 is bonded onto the first logic die LD1 and the second logic die LD2 through the connectors 212 and the conductive features 202. In other words, the bridge 210 is disposed across the second logic dies LD2 at the same side of the first logic die LD1 and a portion of the first logic die LD1. In some embodiments, the conductive pillars 206 electrically connected to the first logic die LD1 are disposed between the bridges 210. The bridge 210 has conductive traces thereon for high speed/bandwidth data transportation between the first logic die LD1 and the second logic dies LD2. In some embodiments, the bridge 210 is a silicon bridge, for example. In some embodiments, top surfaces of the bridges 210 may be lower than top surfaces of the conductive pillars 206. However, the disclosure is not limited thereto. After bonding, an underfill 214 is formed aside the connectors 212 and the conductive features 202 between the bridge 210 and the second logic dies LD2 and between the bridge 210 and the first logic die LD1.

Referring to FIG. 4C, an encapsulant 120B is formed to encapsulate the bridges 210, the underfill 214 and the conductive pillars 206. In some embodiments, the encapsulant 120B is molded, and grinded by a grinding process until a top surface of the encapsulant 120B is substantially flush with the top surfaces of the conductive pillars 206 and the bridges 210. In addition, the conductive pillars 206 and/or the bridges 210 may be partially removed by the grinding process. Then, a redistribution layer structure 130 is formed over the encapsulant 120B and electrically connected to the first logic die LD1 and the second logic dies LD2. In some embodiments, the redistribution layer structure 130 includes a dielectric layer 132 and conductive features 134 in the dielectric layer 132. The conductive features 134 are electrically connected to the first logic die LD1 and the second logic dies LD2 through the conductive pillars 206. After that, a plurality of conductive terminals 140 are formed over and electrically connected to the redistribution layer structure 130.

Referring to FIG. 4D, the structure over the de-bonding layer 104 is separated from the carrier 102 and disposed on a carrier 142. After that, the die attach film 106 is removed. Then, a redistribution layer structure 150 is formed over the encapsulant 120 to electrically connect to the first logic die LD1. In some embodiments, the redistribution layer structure 150 may include a dielectric layer 152 and conductive features 154 in the dielectric layer 152. In some embodiments, the conductive features 154 are micro-bumps. Then, as shown in FIGS. 4D and 5, a plurality of memory dies MD are disposed on and electrically connected to the first logic die LD1. In some embodiments, the memory dies MD are partially overlapped with the first logic die LD1 therebeneath. In some embodiments, the memory dies MD are electrically connected to the first logic die LD1 through the redistribution layer structure 150 and the through vias 116 of the first logic die LD1. It is noted that although the second logic dies LD2 are illustrated as being at one opposite sides of the first logic die LD1, other second logic dies (not shown) may be further disposed at another one opposite sides of the first logic die LD1 as shown in FIG. 2. In other words, the second logic dies LD2 may be disposed at any side(s) of the first logic die LD1.

After that, a heat conduction block HC is disposed onto at least one of the second logic dies LD2. Then, an encapsulant 170 is formed to encapsulate the memory dies MD and the heat conduction blocks HC. Thus, a package structure is formed. In some embodiments, the formation and arrangement of the memory dies MD, the heat conduction block HC and the encapsulant 170 may be similar to those of the memory dies MD, the heat conduction block HC and the encapsulant 170 in FIG. 1D, that is, the second layer of FIG. 4D is similar to the second layer of FIG. 1D, and thus the details are omitted herein.

Figure 4E:
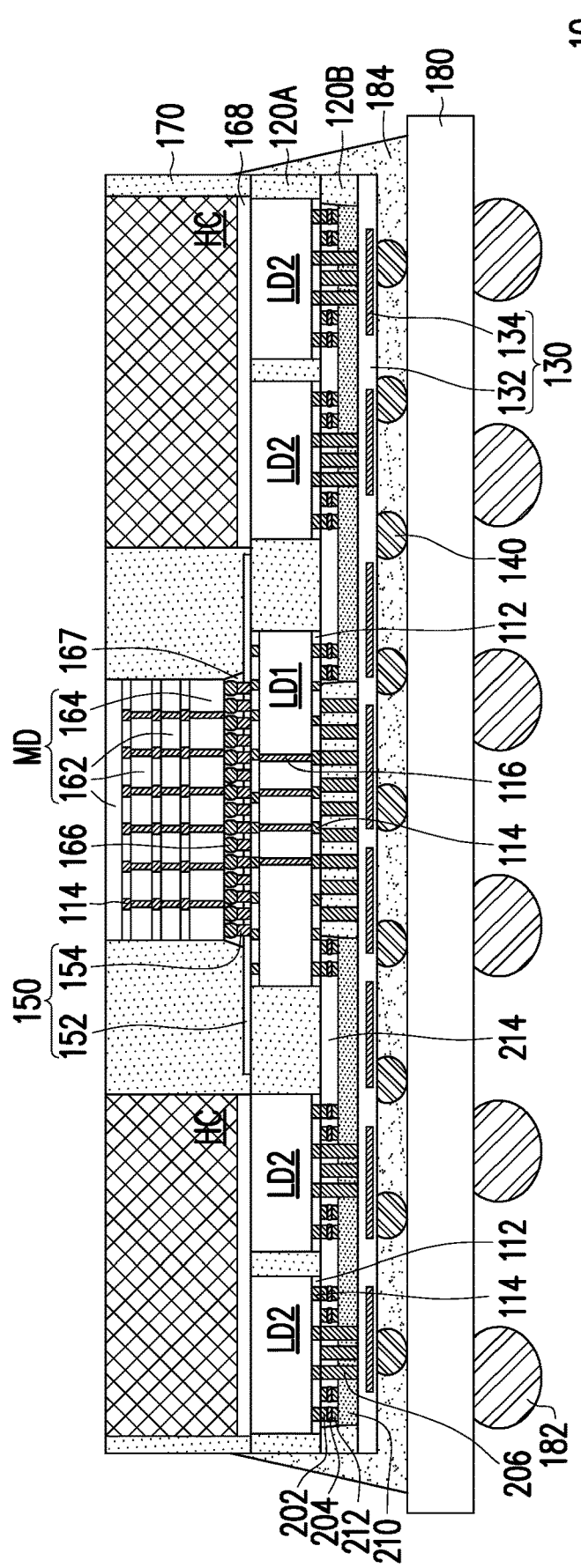

Referring to FIG. 4E, the package structure is de-bonded from the carrier 142 and bonded onto a substrate 180. Then, an underfill 184 is formed aside terminal connectors 182 between the redistribution layer structure 130 and the substrate 180, and a semiconductor package 10 is formed.

Figure 6:
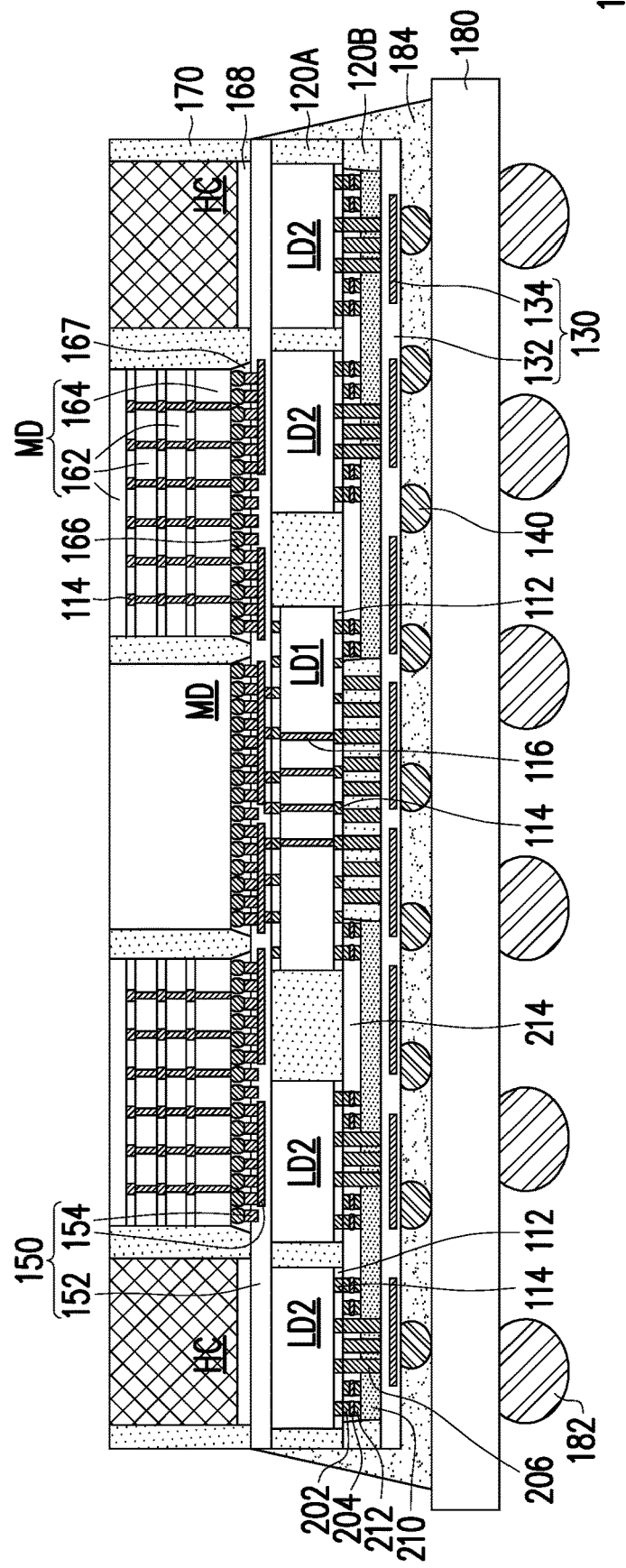
FIG. 6 is a front view of a semiconductor package in accordance with some embodiments.

FIG. 6 is a front view of a semiconductor package in accordance with some embodiments. The semiconductor package of FIG. 6 may be similar to the semiconductor packages of FIGS. 3 and 4E, and thus the same reference numerals are used to refer to the same and liked parts, and its detailed description will be omitted herein. The difference is illustrated in details below.

In some embodiments, a semiconductor package 10 includes a substrate 180, redistribution layer structures 130 and 150, a plurality of bridges 210, a first layer including a first logic die LD1 and a plurality of second logic dies LD2 and a second layer including a plurality of memory dies MD and a plurality of heat conduction blocks HC. In some embodiments, the first layer and the bridges 210 are similar to the first layer and the bridges 210 of the semiconductor package 10 of FIG. 4E, and the second layer is similar to the second layer of the semiconductor package 10 of FIG. 3. Therefore, the details are omitted herein.

Figure 7:
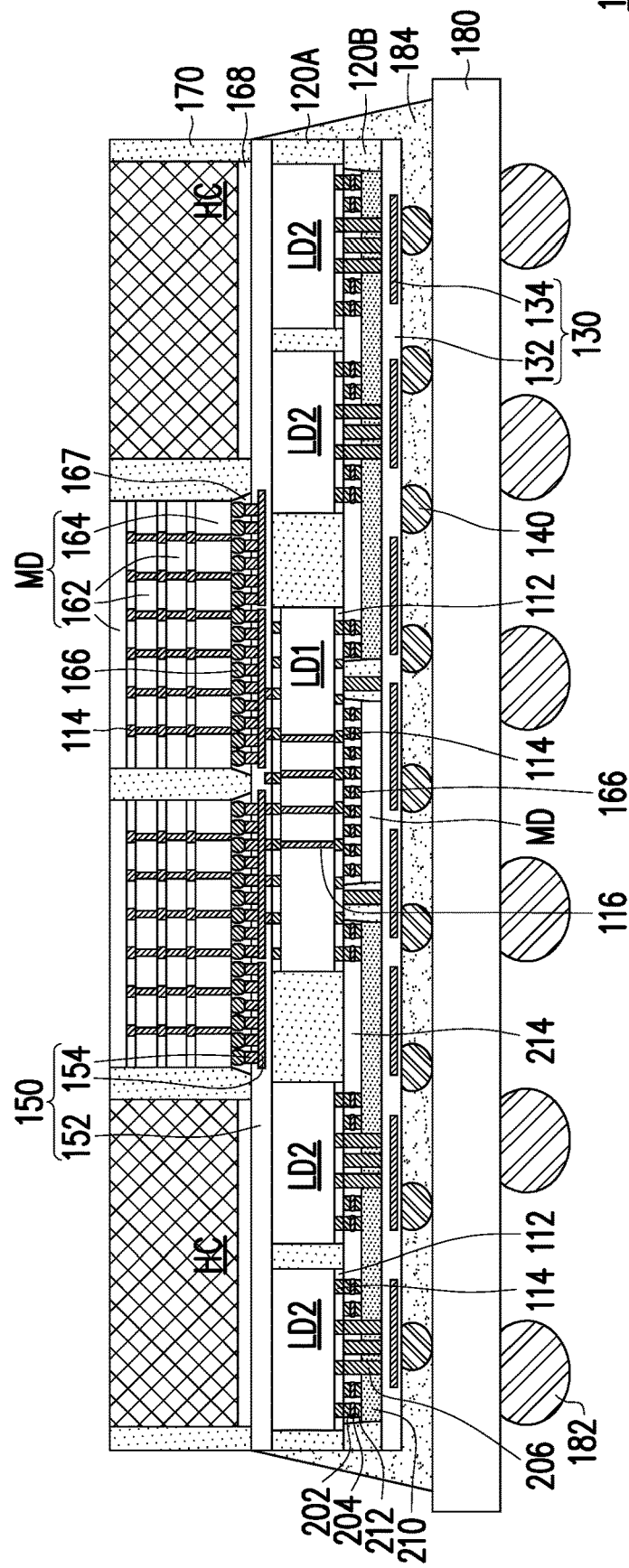
FIG. 7 is a front view of a semiconductor package in accordance with some embodiments.

FIG. 7 is a front view of a semiconductor package in accordance with some embodiments. The semiconductor package of FIG. 7 may be similar to the semiconductor package of FIG. 6, and thus the same reference numerals are used to refer to the same and liked parts, and its detailed description will be omitted herein. The difference is illustrated in details below.

In some embodiments, the main difference between the semiconductors 10 of FIGS. 6 and 7 lies in the disposition of the memory dies MD. In some embodiments, as shown in FIG. 7, at least one memory die MD is disposed under the first logic die LD1. For example, the memory dies MD such as an HBM cube including DRAM dies and HBM controller die are disposed between the heat conduction blocks HC over the first logic die LD1, and the memory die MD such as SDRAM die is disposed between the bridges 210 under the first logic die LD1. In other words, the memory die MD may be inserted into the space formed between the bridges 210 and/or between the first logic die LD1 and the redistribution layer structure 130. In some embodiments, the memory die MD under the first logic die LD1 is electrically connected to the first logic die LD1 through connectors 166 and conductive features 202. In some embodiments, the bonding between the bridges 210 and the first logic die LD1 is similar to the bonding between the bridges 210 and the second logic dies LD2. For example, the conductive features 202 between the bridges 210 and the first logic die LD1 may be formed simultaneously with the conductive features 202 between the bridges 210 and the second logic dies LD2, and an underfill 214 aside the connectors 166 and the conductive features 202 may be formed simultaneously with the underfill 214 aside the connectors 212 and the conductive features 202.

FIG. 8A to FIG. 8E are lateral views of a method of forming a semiconductor package in accordance with some embodiments. FIG. 9 is a top view of a semiconductor package, and FIG. 8A to FIG. 8E are viewing from a lateral side LS of FIG. 9. The method of FIG. 8A to FIG. 8E may be similar to the method of FIG. 1A to FIG. 1E, and thus the same reference numerals are used to refer to the same and liked parts, and its detailed description will be omitted herein. The difference is illustrated in details below.

Figure 8A:
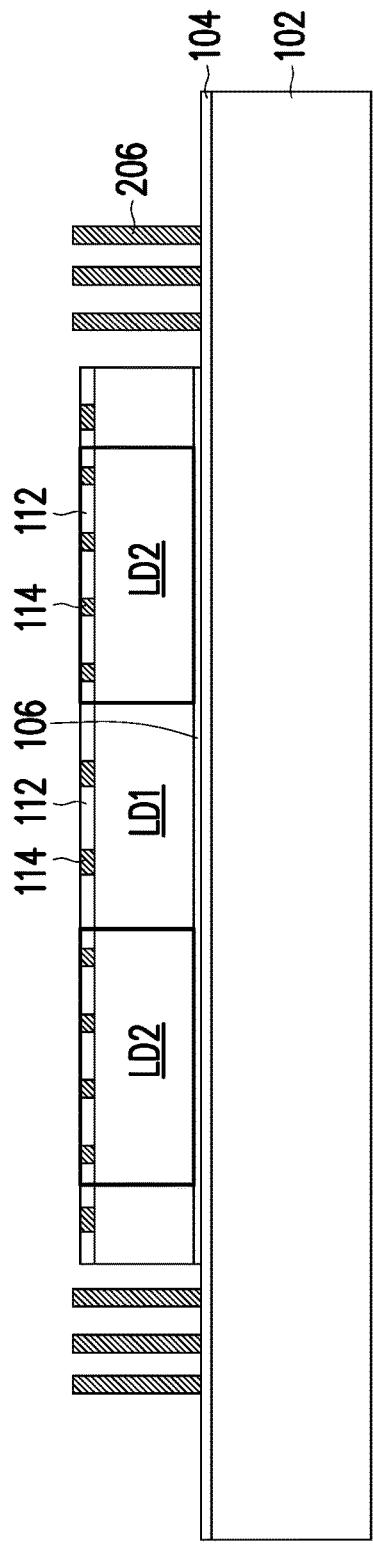

Referring to FIG. 8A, a plurality of conductive pillars 206 are formed on a de-bonding layer 104 over a carrier 102. Then, a first logic die LD1 and a plurality of second logic dies LD2 are disposed onto the de-bonding layer 104 between the conductive pillars 206. In some embodiments, the first logic die LD1 and the second logic dies LD2 may be picked and placed onto the de-bonding layer 104 through die attach films 106. In some embodiments, as shown in FIG. 9, the second logic dies LD2 are disposed in front of the first logic die LD1 when viewing from the lateral side LS. In some embodiments, a size of the die attach film 106 may be substantially the same as a size of the first logic die LD1 or the second logic die LD2. In other words, a sidewall of the die attach film 106 may be substantially flush with a sidewall of the first logic die LD1 or the second logic die LD2. However, the disclosure is not limited thereto.

Figure 8B:
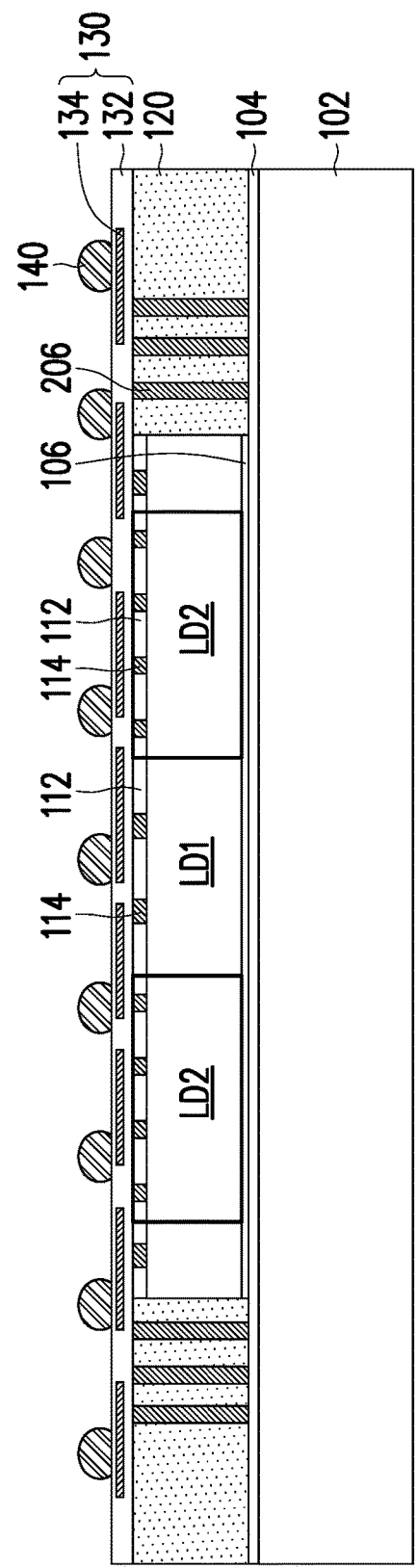

Referring to FIG. 8B, an encapsulant 120 is formed to encapsulate the first logic die LD1, the second logic dies LD2 and the conductive pillars 206. Then, a redistribution layer structure 130 is formed over the encapsulant 120 and electrically connected to the first logic die LD1, the second logic dies LD2 and the conductive pillars 206. After that, a plurality of conductive terminals 140 are formed over and electrically connected to the redistribution layer structure 130.

Referring to FIG. 8C, the structure over the de-bonding layer 104 is separated from the carrier 102, and the formed structure is turned upside down and disposed on a carrier 142. After that, the die attach films 106 are removed. Then, a redistribution layer structure 150 is formed over the encapsulant 120 to electrically connect to the conductive pillars 206. In some embodiments, the redistribution layer structure 150 may include a dielectric layer 152 and conductive features 154 in the dielectric layer 152. In some embodiments, the topmost conductive features 154 may be micro-bumps, and other conductive features 154 may be conductive lines and/or conductive vias.

Referring to FIG. 8D, a plurality of memory dies MD are disposed on and electrically connected to the redistribution layer structure 150. In some embodiments, the memory dies MD are partially overlapped with the first logic die LD1 therebeneath. In some embodiments, the memory dies MD are electrically connected to the redistribution layer structure 130 through the redistribution layer structure 150 and the conductive pillars 206. The memory dies MD are electrically connected to the first logic die LD1 and the second logic dies LD2. After that, a heat conduction block HC is disposed over the first logic die LD1 and the second logic dies LD2. In some embodiments, the heat conduction block HC is disposed between the memory dies MD. In some embodiments, the memory dies MD and the heat conduction block HC are disposed at the same level and are collectively referred to as the second layer. Then, an encapsulant 170 is formed to encapsulate the memory dies MD and the heat conduction block HC. After that, a package structure is formed over the carrier 142.

Figure 8E:
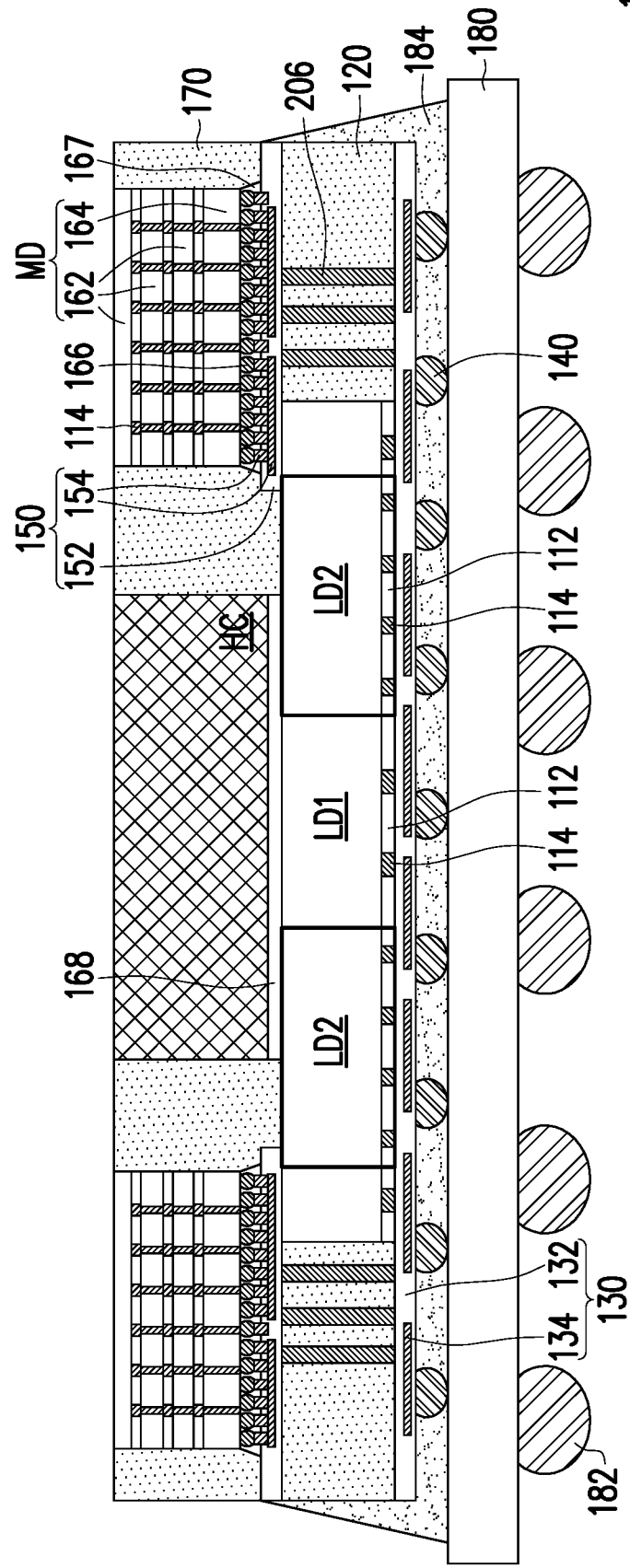

Referring to FIG. 8E, the package structure is de-bonded from the carrier 142 and bonded onto a substrate 180. Then, an underfill 184 is formed aside terminal connectors 182 between the redistribution layer structure 130 and the substrate 180, and a semiconductor package 10 is formed.

Figure 10:
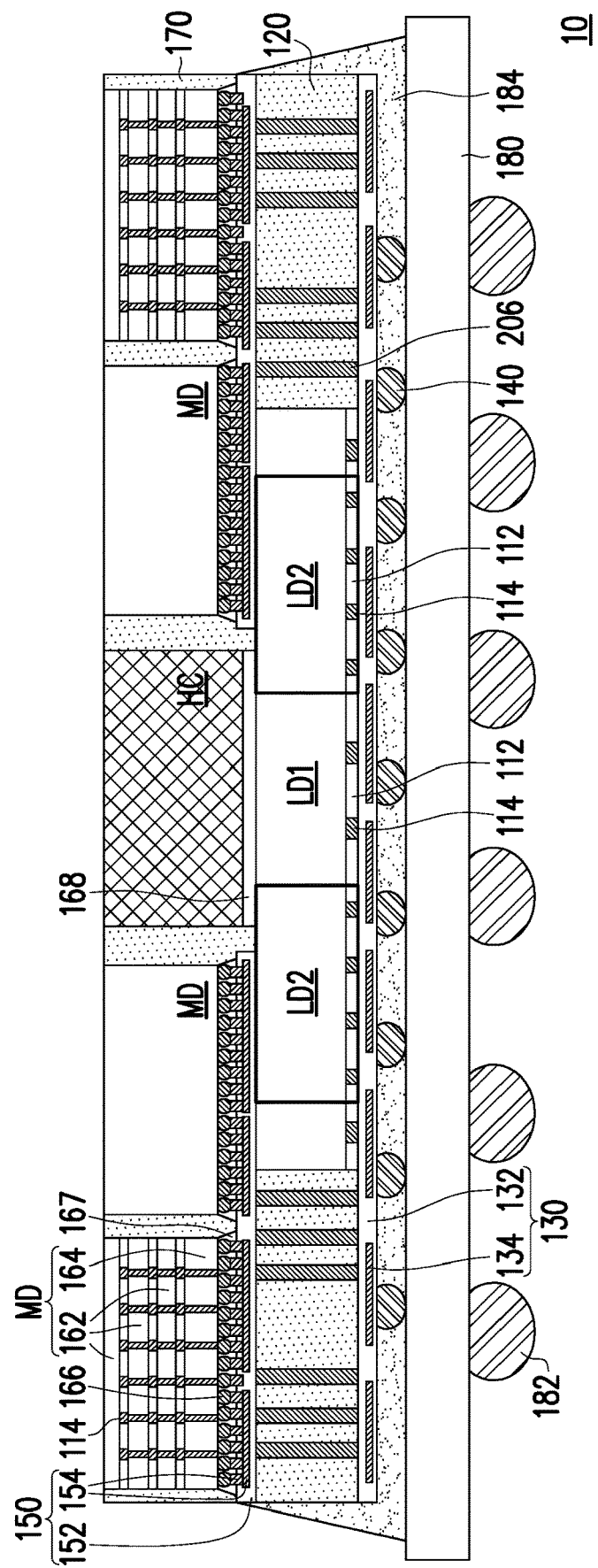
FIG. 10 is a lateral view of a semiconductor package in accordance with some embodiments.

FIG. 10 is a lateral view of a semiconductor package in accordance with some embodiments. The semiconductor package of FIG. 10 may be similar to the semiconductor package of FIG. 8E, and thus the same reference numerals are used to refer to the same and liked parts, and its detailed description will be omitted herein. The difference is illustrated in details below.

In some embodiments, the main difference between the semiconductors 10 of FIGS. 10 and 8E lies in the second layer. In some embodiments, as shown in FIG. 10, more memory dies MD are disposed in the second layer over the first logic die LD1 and the second logic dies LD2. In some embodiments, some of the memory dies MD (e.g., inner memory dies) are partially overlapped with the first logic die LD1 therebeneath. Some of the memory dies MD (e.g., outer memory dies) are not overlapped with the first logic die LD1 therebeneath. In some embodiments, the memory dies MD may be electrically connected to the redistribution layer structure 130 through the redistribution layer structure 150 and the conductive pillars 206.

FIG. 11A to FIG. 11E are lateral views of a method of forming a semiconductor package in accordance with some embodiments. FIG. 12 is a top view of a semiconductor package, and FIG. 11A to FIG. 11E are viewing from a lateral side LS of FIG. 12. The method of FIG. 11A to FIG. 11E may be similar to the method of FIG. 8A to FIG. 8E, and thus the same reference numerals are used to refer to the same and liked parts, and its detailed description will be omitted herein. The difference is illustrated in details below.

Figure 11A:
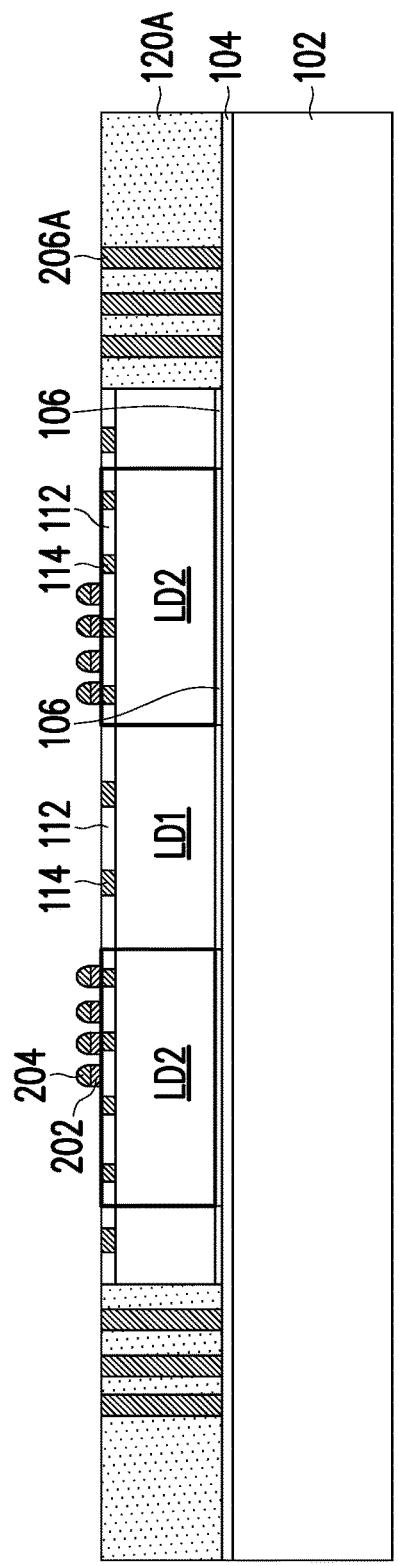
FIG. 11A to FIG. 11E are lateral views of a method of forming a semiconductor package in accordance with some embodiments.
Figure 12:
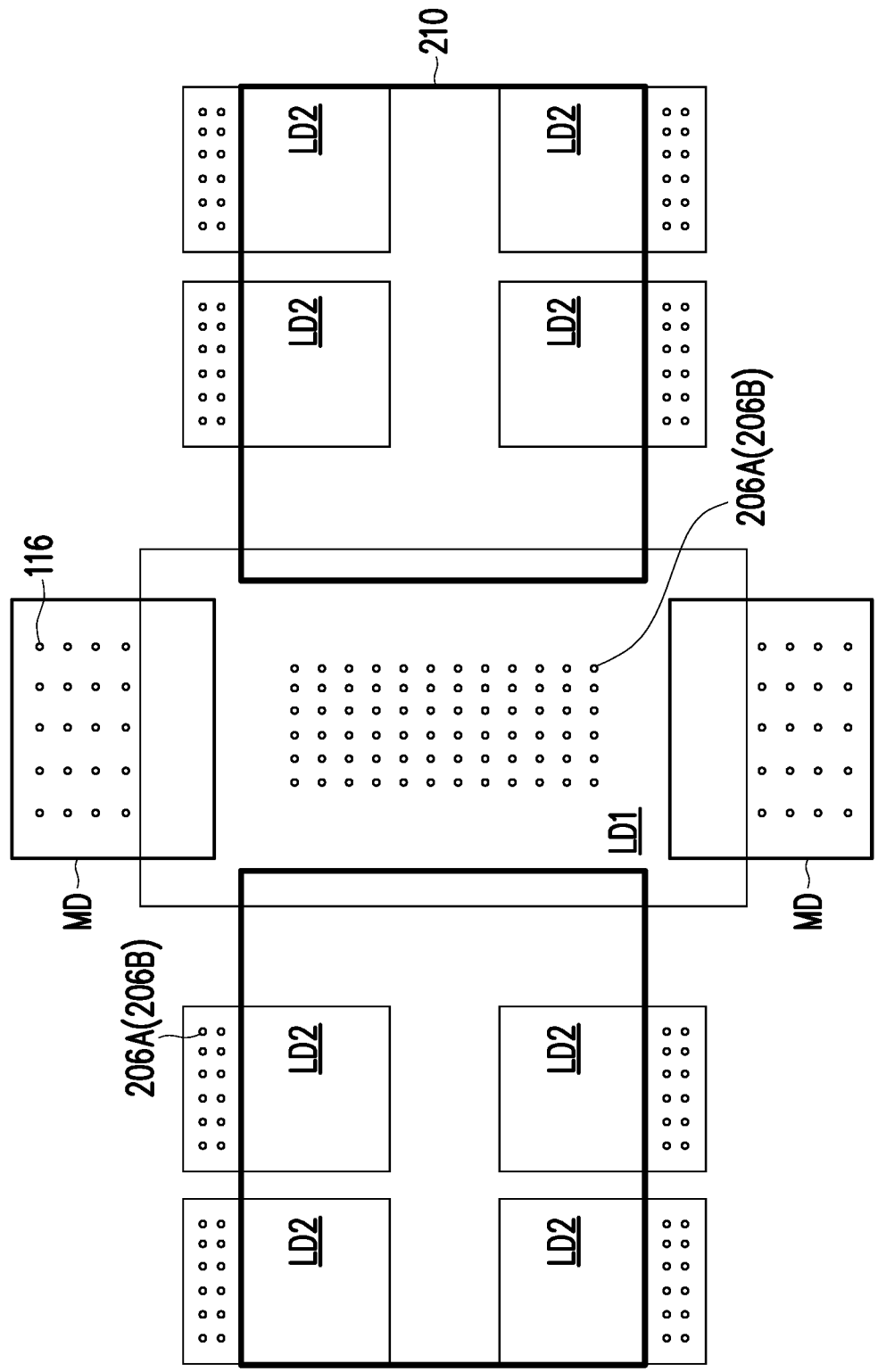
FIG. 12 is a top view of a semiconductor package.

Referring to FIG. 11A, a plurality of conductive pillars 206A, a first logic die LD1 and a plurality of second logic dies LD2 are disposed onto a de-bonding layer 104 over a carrier 102. Then, an encapsulant 120A is formed to encapsulate the conductive pillars 206A, the first logic die LD1 and the second logic dies LD2. After that, a plurality of conductive features 202 and a plurality of solder layers 204 are formed on and electrically connected to the second logic dies LD2. The forming the conductive pillars 206A, the first logic die LD1, the second logic dies LD2 and the encapsulant 120A are similar to the forming the conductive pillars 206A, the first logic die LD1, the second logic dies LD2 and the encapsulant 120 in FIGS. 8A and 8B, and thus details are omitted herein.

Figure 11B:
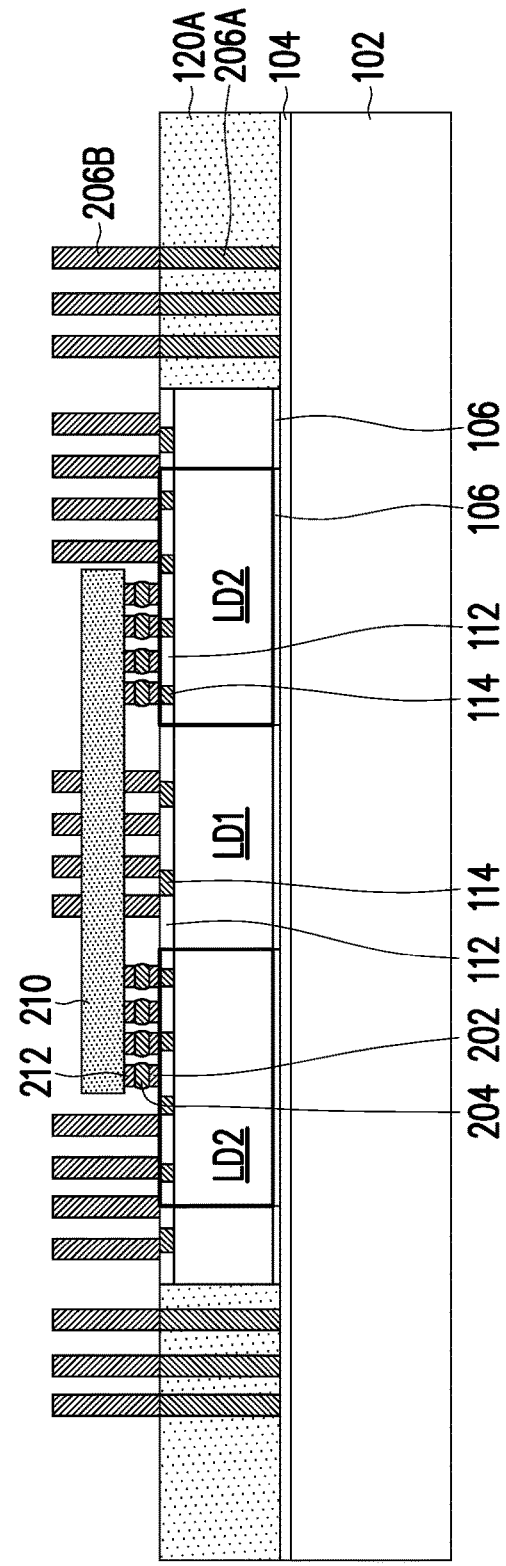

Referring to FIG. 11B, a plurality of conductive pillars 206B are formed on and electrically connected to the conductive pillars 206A respectively. After that, a bridge 210 is bonded onto the first logic die LD1 and the second logic dies LD2, so as to electrically connect the first logic die LD1 and the second logic dies LD2.

Figure 11C:
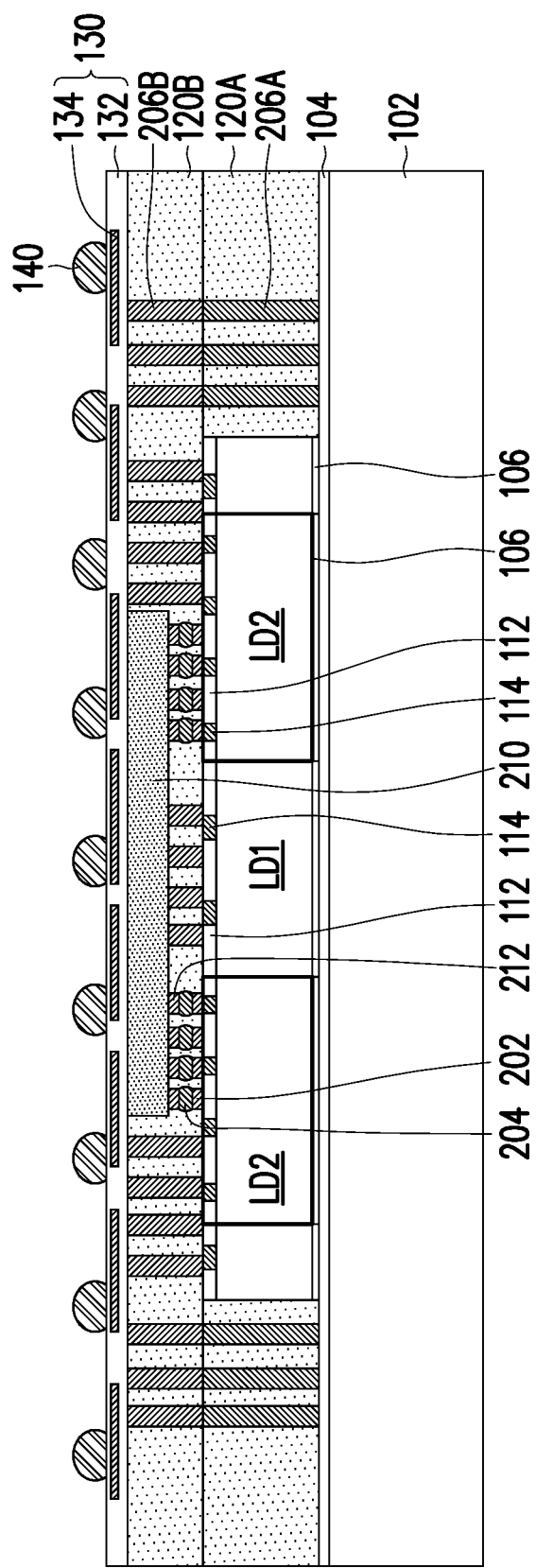

Referring to FIG. 11C, an encapsulant 120B is formed to encapsulate the bridges 210 and the conductive pillars 206B. In some embodiments, the encapsulant 120B is molded, and grinded by a grinding process until a top surface of the encapsulant 120B is substantially flush with the top surfaces of the conductive pillars 206B and the bridges 210. In some embodiments, the conductive pillars 206B and/or the bridges 210 may be also partially removed by the grinding process. Then, a redistribution layer structure 130 is formed over the encapsulant 120B and electrically connected to the first logic die LD1 and the second logic dies LD2 through the conductive pillars 206A and 206B. After that, a plurality of conductive terminals 140 are formed over and electrically connected to the redistribution layer structure 130.

Figure 11D:
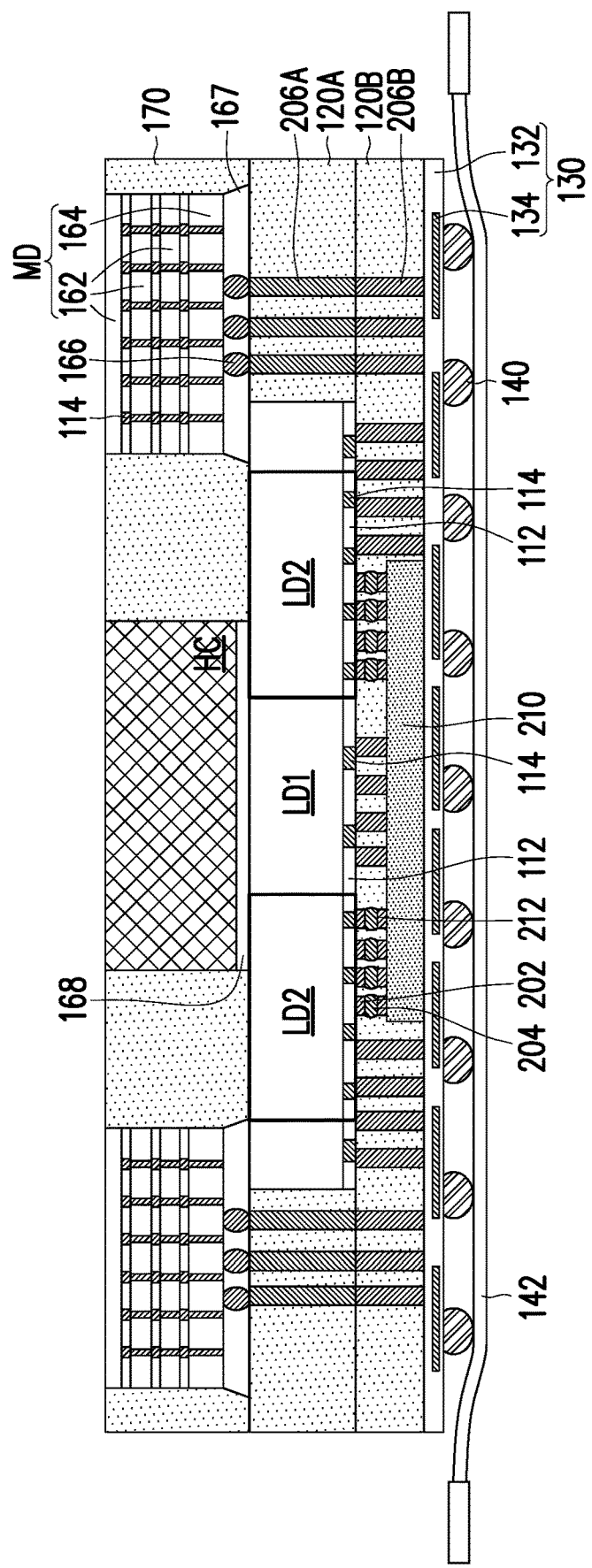

Referring to FIG. 11D, the structure over the de-bonding layer 104 is separated from the carrier 102 and disposed on a carrier 142. After that, the die attach film 106 is removed. Then, as shown in FIGS. 11D and 12, a plurality of memory dies MD are disposed on and electrically connected to the conductive pillars 206B. In some embodiments, the memory die MD is electrically connected to the redistribution layer structure 130 through the conductive pillars 206A and 206B. After that, a heat conduction block HC is disposed over the first logic die LD1 and the second logic dies LD2. In some embodiments, the heat conduction block HC is disposed between the memory dies MD. Then, an encapsulant 170 is formed to encapsulate the memory die MD and the heat conduction blocks HC. After that, a package structure is formed.

Figure 11E:
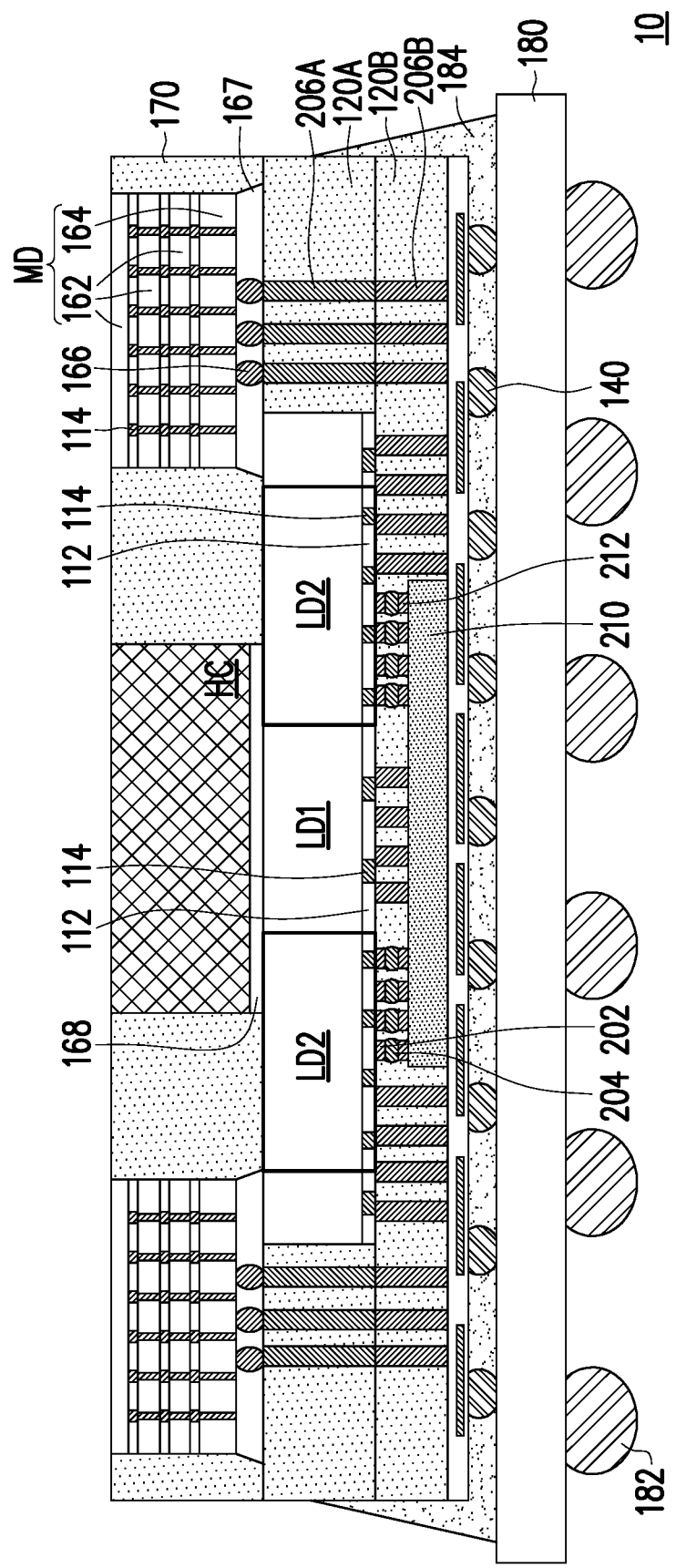

Referring to FIG. 11E, the package structure is de-bonded from the carrier 142 and bonded onto a substrate 180. Then, an underfill 184 is formed aside terminal connectors 182 between the redistribution layer structure 130 and the substrate 180, and a semiconductor package 10 is formed.

Figure 13:
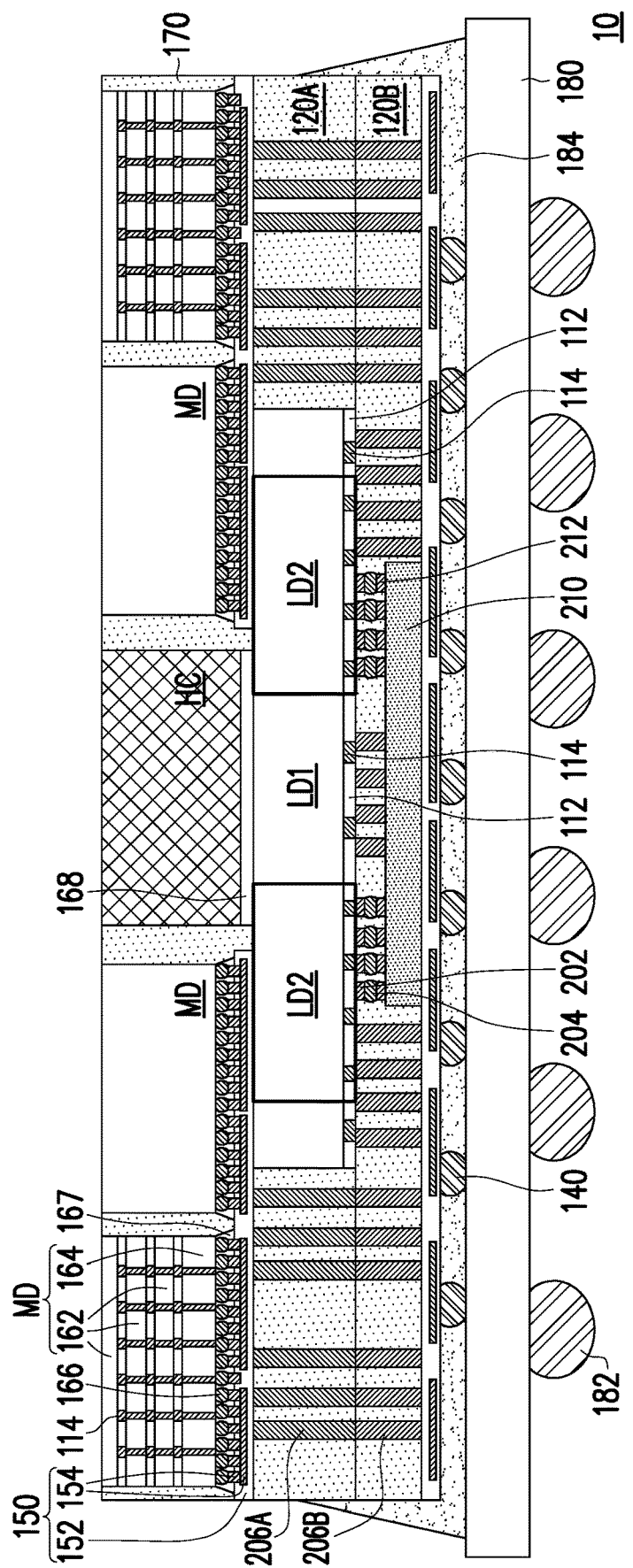
FIG. 13 is a lateral view of a semiconductor package in accordance with some embodiments.

FIG. 13 is a lateral view of a semiconductor package in accordance with some embodiments. The semiconductor package of FIG. 13 may be similar to the semiconductor package of FIG. 11E, and thus the same reference numerals are used to refer to the same and liked parts, and its detailed description will be omitted herein. The difference is illustrated in details below.

In some embodiments, the main difference between the semiconductors 10 of FIGS. 13 and 11E lies in the second layer. In some embodiments, the second layer is similar to the second layer of the semiconductor package 10 of FIG. 10. In some embodiments, the memory dies MD are electrically connected to the redistribution layer structure 130 through the redistribution layer structure 150 and the conductive pillars 206A and 206B. The memory dies MD are electrically connected to the first logic die LD1 and the second logic dies LD2.

FIG. 14A to FIG. 14E are front views of a method of forming a semiconductor package in accordance with some embodiments. FIG. 15 is a top view of a semiconductor package, and FIG. 14A to FIG. 14E are viewing from a front side FS of FIG. 15. The method of FIG. 14A to FIG. 14E may be similar to the method of FIG. 4A to FIG. 4E, and thus the same reference numerals are used to refer to the same and liked parts, and its detailed description will be omitted herein. The difference is illustrated in details below.

Figure 14A:
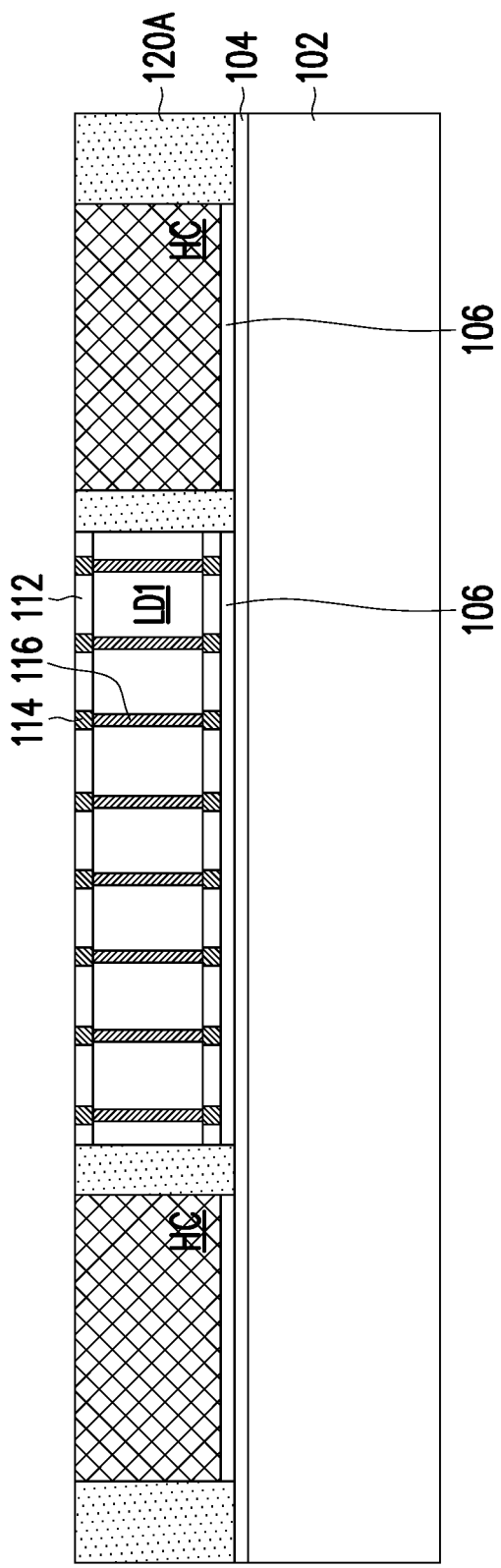
FIG. 14A to FIG. 14E are front views of a method of forming a semiconductor package in accordance with some embodiments.
Figure 15:
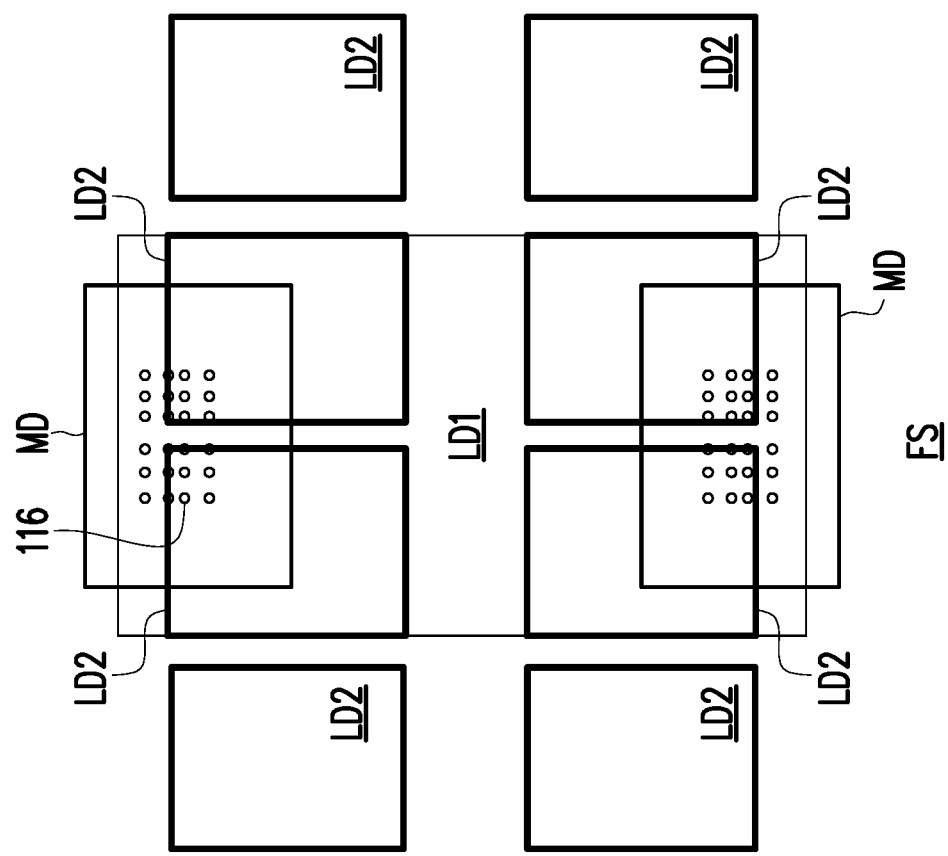
FIG. 15 is a top view of a semiconductor package.

Referring to FIG. 14A, a first logic die LD1 and a plurality of heat conduction blocks HC are disposed onto a de-bonding layer 104 over a carrier 102. The first logic die LD1 and a plurality of heat conduction blocks HC are picked and placed onto a de-bonding layer 104 through a die attach film 106 respectively. Then, an encapsulant 120A is formed to encapsulate the first logic die LD1 and the heat conduction blocks HC. In some embodiments, the encapsulant 120A is molded, and grinded by a grinding process until a top surface of the encapsulant 120A is substantially flush with top surfaces of the first logic die LD1 and the heat conduction blocks HC. In some alternative embodiments, upper portions of the first logic die LD1 (i.e., a dielectric layer 112 and connectors 114) and/or the heat conduction blocks HC may be also partially removed by the grinding process. In some embodiments, the heat conduction blocks HC may be configured as both a heat dissipation feature that transfers heat away from the integrated circuits and a plane for to be-formed redistribution layer structure 130.

Figure 14B:
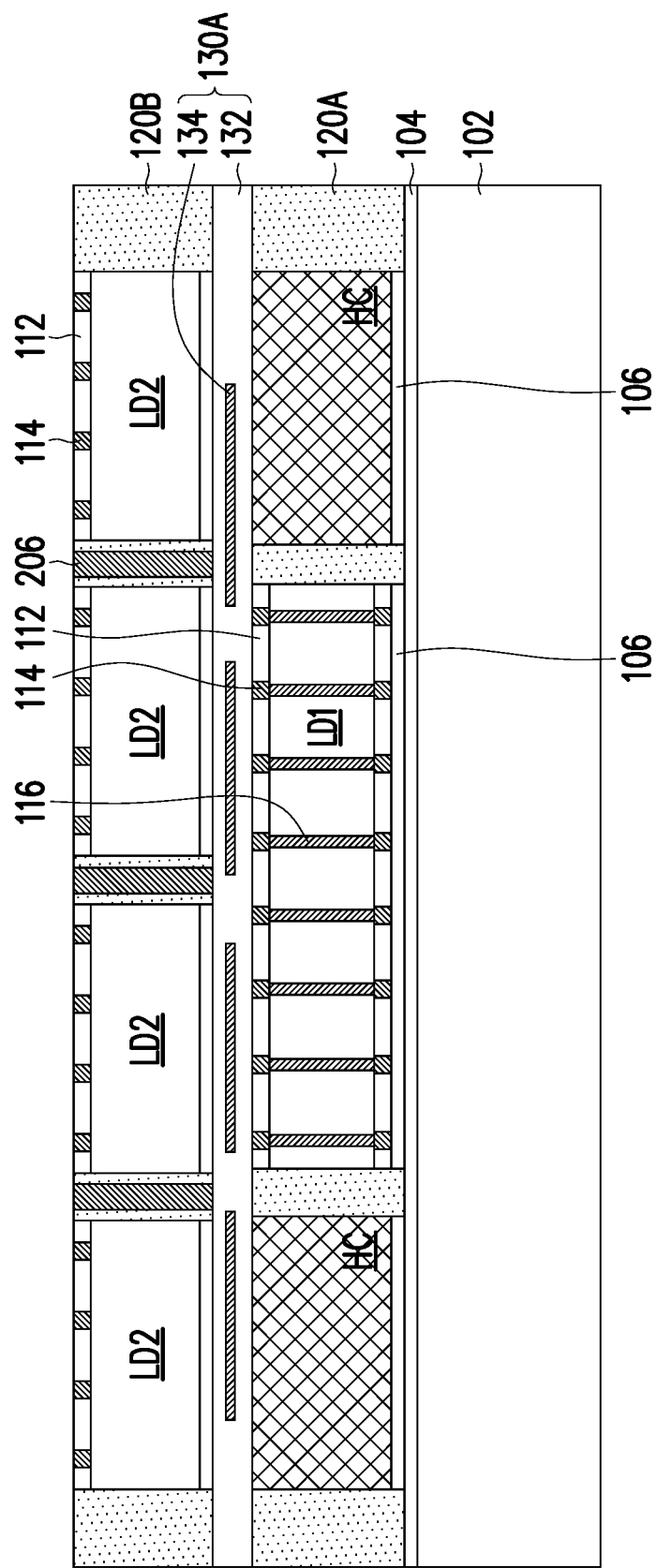

Referring to FIG. 14B, a redistribution layer structure 130A is formed over the encapsulant 120A, the first logic die LD1 and the heat conduction blocks HC, to electrically connect to the first logic die LD1. After that, a plurality of conductive pillars 206 are formed over and electrically connected to the redistribution layer structure 130A. Then, a plurality of second logic dies LD2 are disposed on and electrically connected to the redistribution layer structure 130A. In some embodiments, the second logic dies LD2 and the conductive pillars 206 are alternately disposed. Then, an encapsulant 120B is formed to encapsulate the second logic dies LD2 and the conductive pillars 206. In some embodiments, the encapsulant 120B is molded, and grinded by a grinding process until a top surface of the encapsulant 120B is substantially flush with top surfaces of the second logic dies LD2 and the conductive pillars 206. In some alternative embodiments, upper portions of the second logic dies LD2 and/or the conductive pillars 206 may be also partially removed by the grinding process.

Figure 14C:
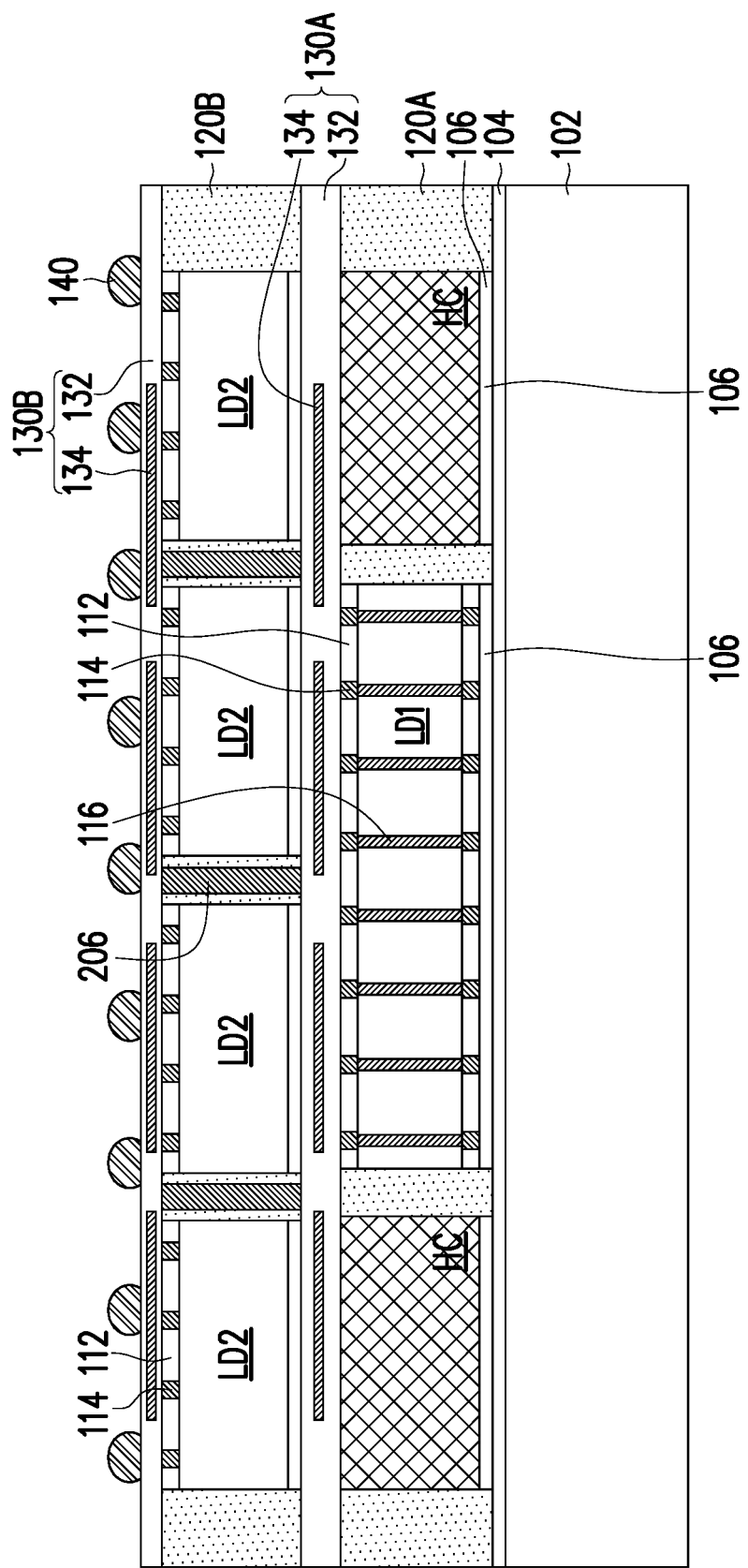

Referring to FIG. 14C, a redistribution layer structure 130B is formed over the encapsulant 120B. In some embodiments, the redistribution layer structure 130B may be electrically connected to the second logic dies LD2, and the redistribution layer structure 130B may be electrically connected to the redistribution layer structure 130A through the conductive pillars 206. Then, a plurality of conductive terminals 140 are formed over and electrically connected to the redistribution layer structure 130B.

Figure 14D:
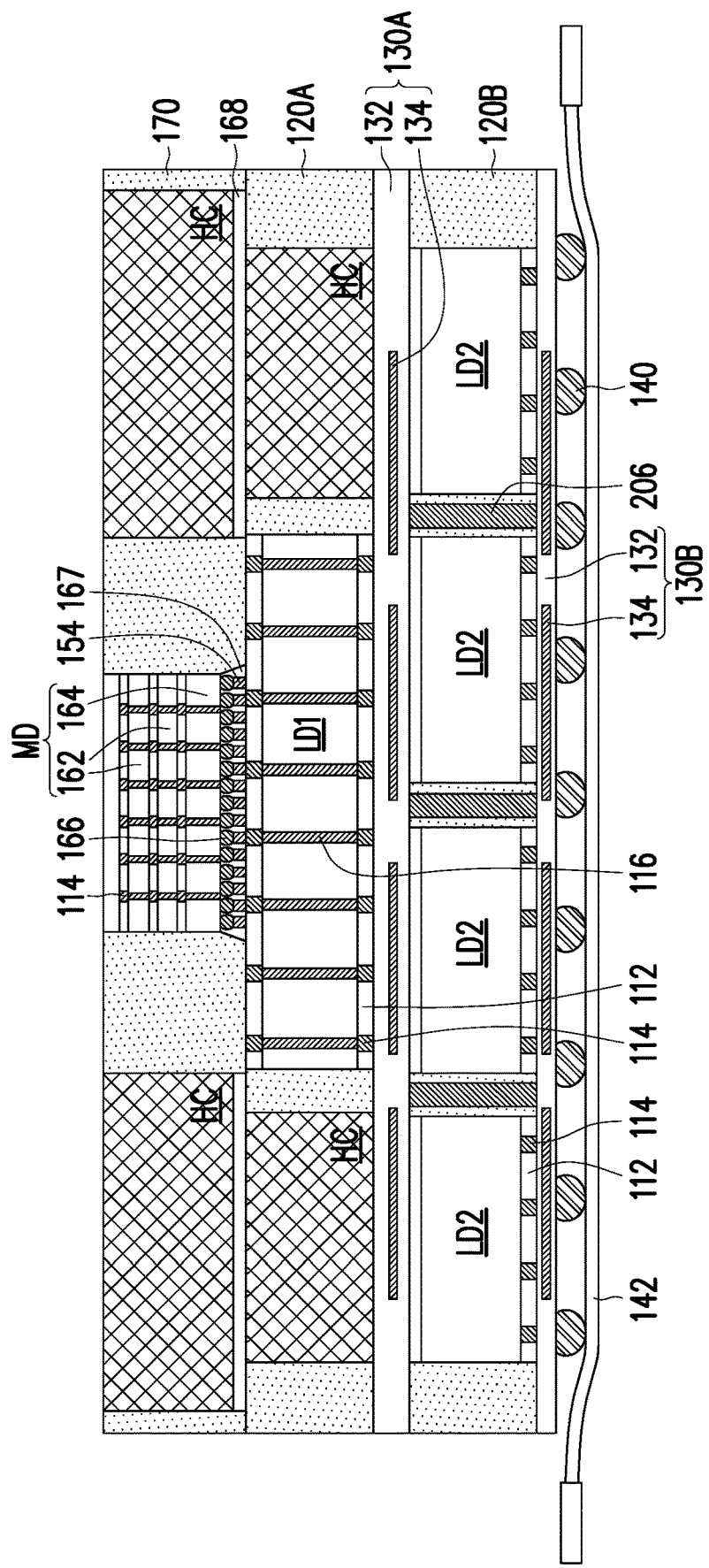

Referring to FIG. 14D, the structure over the de-bonding layer 104 is separated from the carrier 102, and the formed structure is turned upside down and disposed on a carrier 142. After that, the die attach film 106 is removed. Then, a plurality of conductive features 154 are formed on and electrically connected to the first logic die LD1. After that, as shown in FIG. 15, a plurality of memory dies MD are disposed on the first logic die LD1 and electrically connected to the first logic die LD1 through the conductive features 154. Then, a plurality of heat conduction blocks HC are disposed aside the memory dies MD over the heat conduction blocks HC through thermally conductive adhesives 168. In some embodiments, the thermally conductive adhesive 168 is disposed between and in direct contact with the stacked heat conduction blocks HC. In some embodiments, a size of the upper heat conduction block HC is larger than a size of the lower upper heat conduction block HC, for example. However, the disclosure is not limited thereto. In some alternative embodiments, a size of the upper heat conduction block HC may be substantially equal to or smaller than a size of the lower upper heat conduction block HC. In other words, a size of the heat conduction block HC may be adjusted according to the requirements. Then, an encapsulant 170 is formed to encapsulate the memory dies MD and the heat conduction blocks HC. In some embodiments, the encapsulant 170 is molded, and grinded by a grinding process until a top surface of the encapsulant 170 is substantially flush with top surfaces of the memory dies MD and the heat conduction blocks HC. In some alternative embodiments, upper portions of the memory dies MD and the heat conduction blocks HC may be also partially removed by the grinding process. Then, a package structure is formed.

Figure 14E:
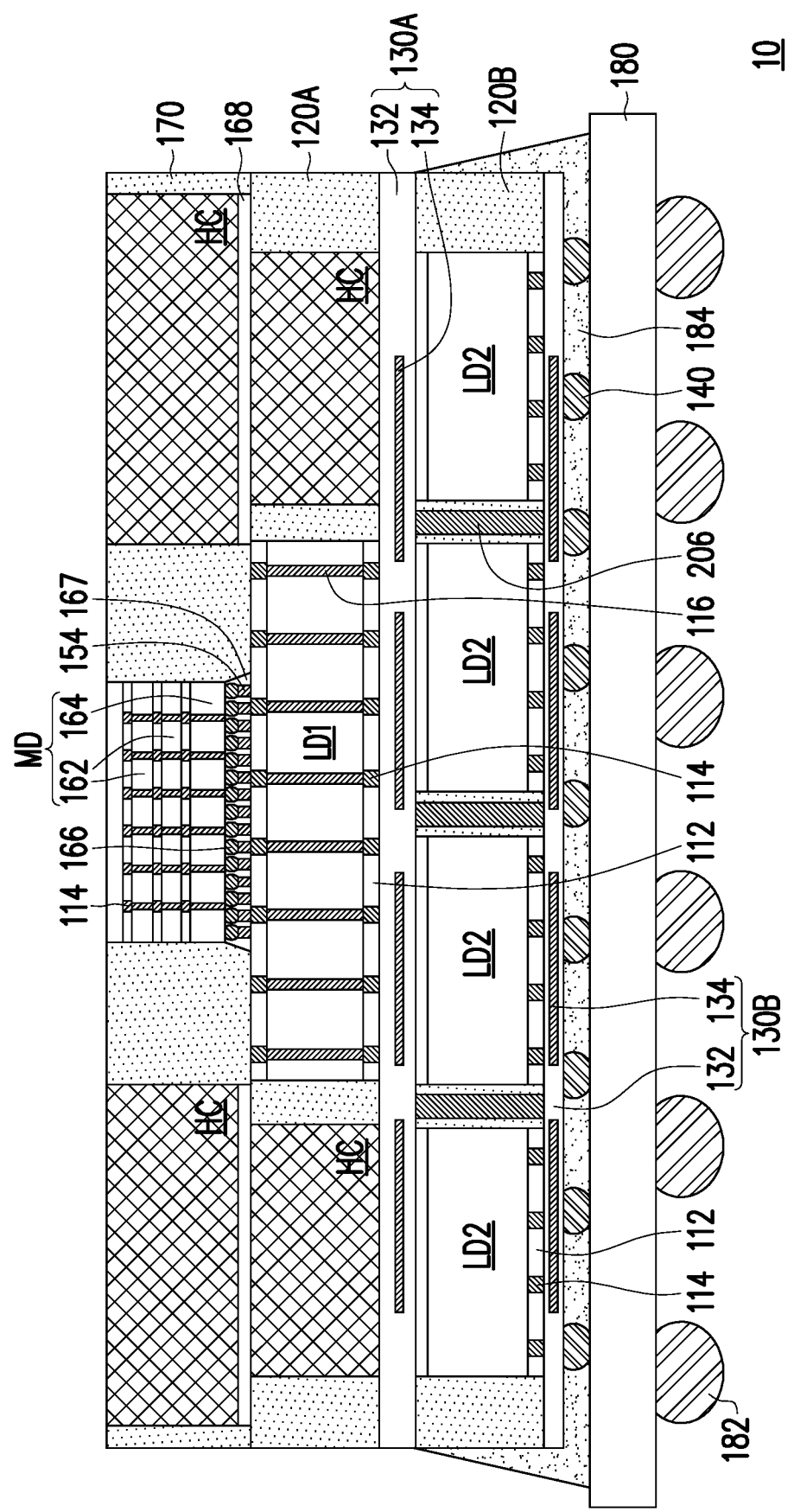

Referring to FIG. 14E, the package structure is de-bonded from the carrier 142 and bonded onto a substrate 180. Then, an underfill 184 is formed aside terminal connectors 182 between the redistribution layer structure 130B and the substrate 180, and a semiconductor package 10 is formed. In some embodiments, the first logic die LD1, the second logic die LD2 and the memory dies MD are stacked, and thus the semiconductor package 10 is also referred to as a 3D package. In some embodiments, a plurality of heat conduction blocks HC are disposed aside the integrated dies such as the first logic die LD1 and the memory dies MD, and thus the heat generated by the integrated dies may be dissipated efficiently.

Figure 16:
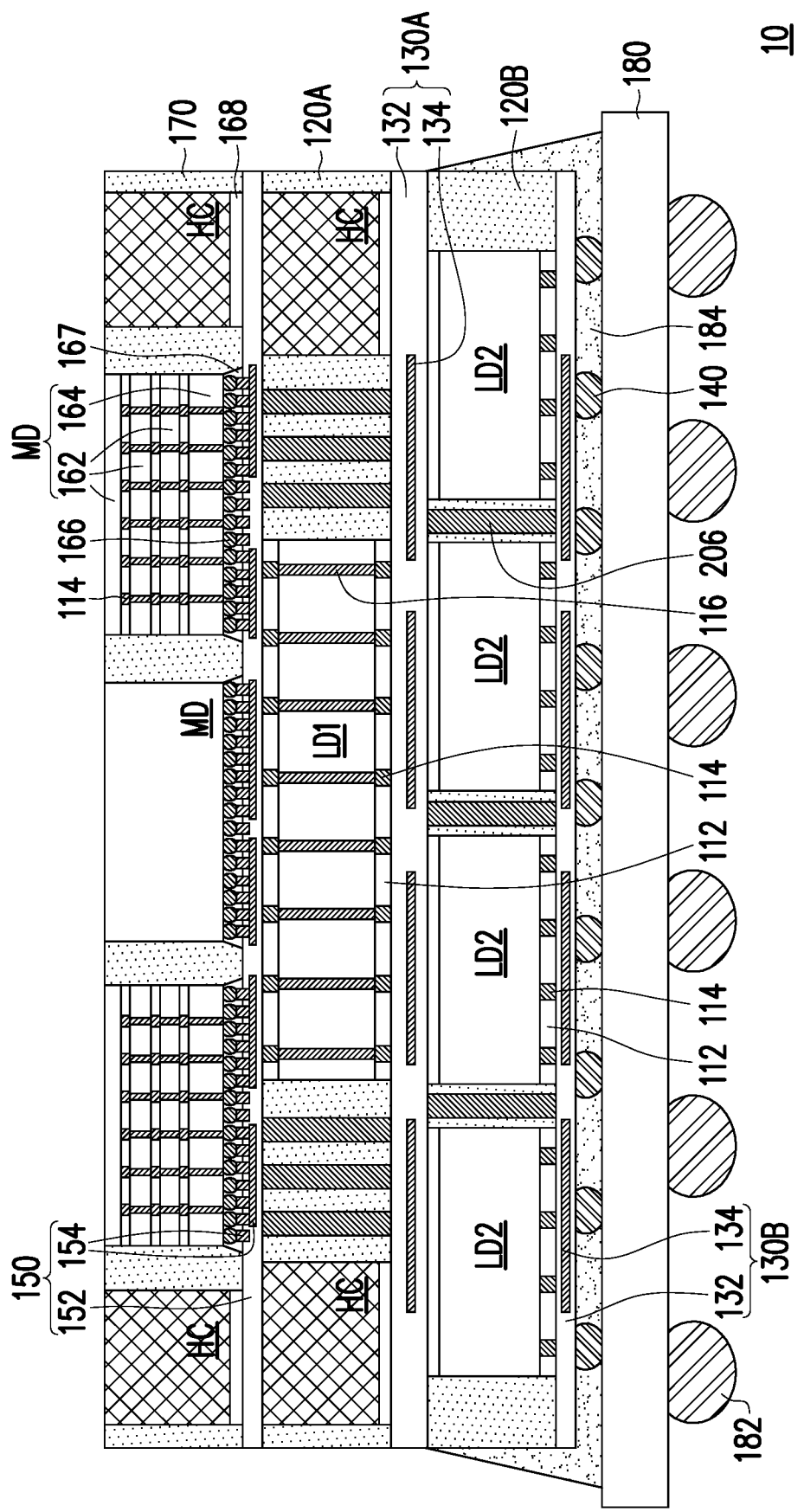
FIG. 16 is a front view of a semiconductor package in accordance with some embodiments.

FIG. 16 is a front view of a semiconductor package in accordance with some embodiments. The semiconductor package of FIG. 16 may be similar to the semiconductor package of FIG. 14E, and thus the same reference numerals are used to refer to the same and liked parts, and its detailed description will be omitted herein. The difference is illustrated in details below.

In some embodiments, the main difference between the semiconductors 10 of FIGS. 16 and 14E lies in the disposition of the memory dies MD. In some embodiments, the disposition of the memory dies MD is similar to the second layer of the semiconductor package 10 of FIG. 3, and thus the details are omitted. In some embodiments, the memory die MD may be electrically connected to the redistribution layer structure 130A through the redistribution layer structure 150 and the through vias 116 of the first logic die LD1, or the memory die MD may be electrically connected to the redistribution layer structure 130A through the redistribution layer structure 150 and the conductive pillars 206A. The memory dies MD are electrically connected to the first logic die LD1 and the second logic dies LD2.

FIG. 17A to FIG. 17E are lateral views of a method of forming a semiconductor package in accordance with some embodiments. FIG. 18 is a top view of a semiconductor package, and FIG. 17A to FIG. 17E are viewing from a lateral side LS of FIG. 18. The method of FIG. 17A to FIG. 17E may be similar to the method of FIG. 4A to FIG. 4E, and thus the same reference numerals are used to refer to the same and liked parts, and its detailed description will be omitted herein. The difference is illustrated in details below.

Figure 17A:
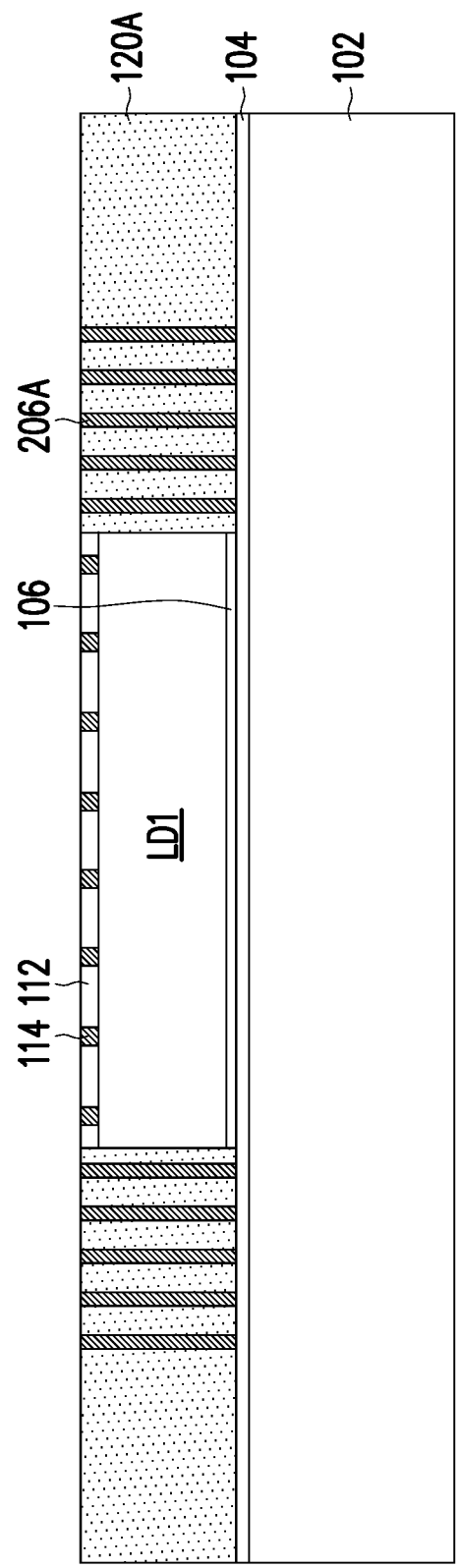
FIG. 17A to FIG. 17E are lateral views of a method of forming a semiconductor package in accordance with some embodiments.
Figure 18:
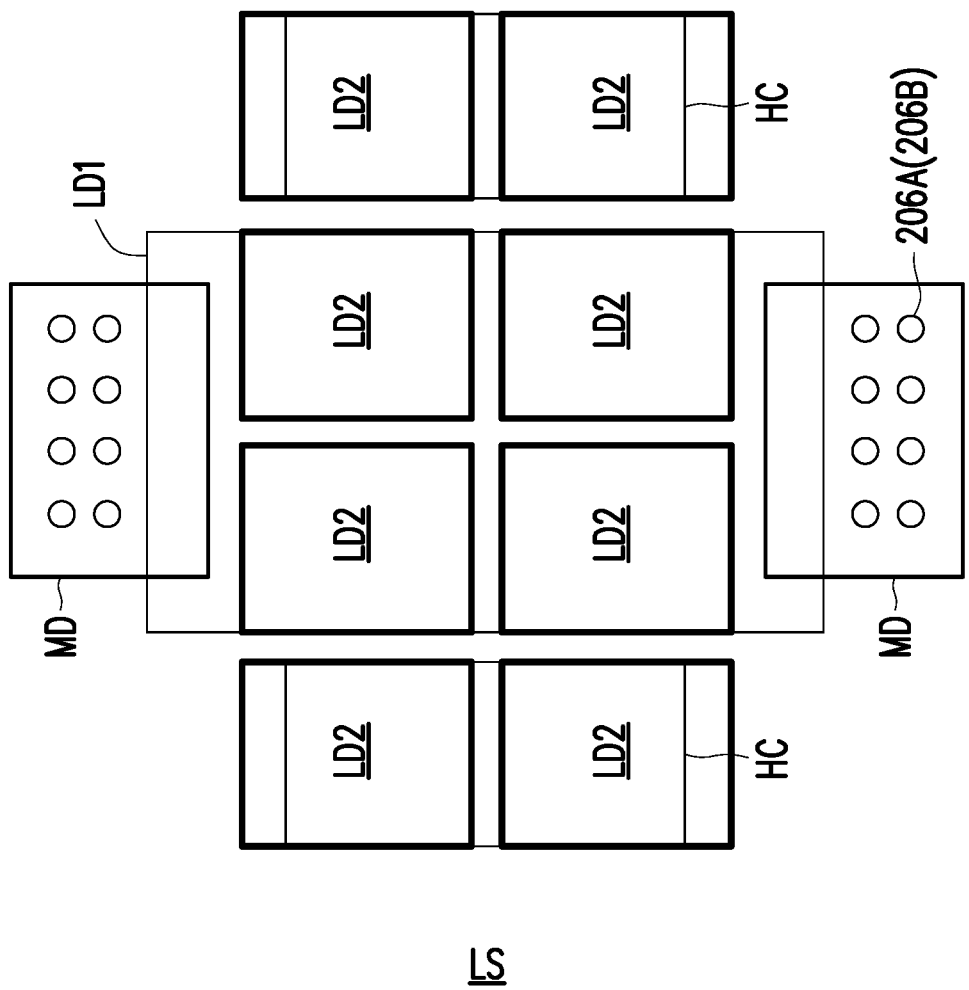
FIG. 18 is a top view of a semiconductor package.

Referring to FIG. 17A, a plurality of conductive pillars 206A are formed on a de-bonding layer 104 over a carrier 102. Then, a first logic die LD1 is disposed onto the de-bonding layer 104 between the conductive pillars 206A through a die attach film 106. In some embodiments, the conductive pillars 206A are at opposite sides of the first logic die LD1, for example. Then, an encapsulant 120A is formed to encapsulate the first logic die LD1 and the conductive pillars 206A.

Figure 17B:
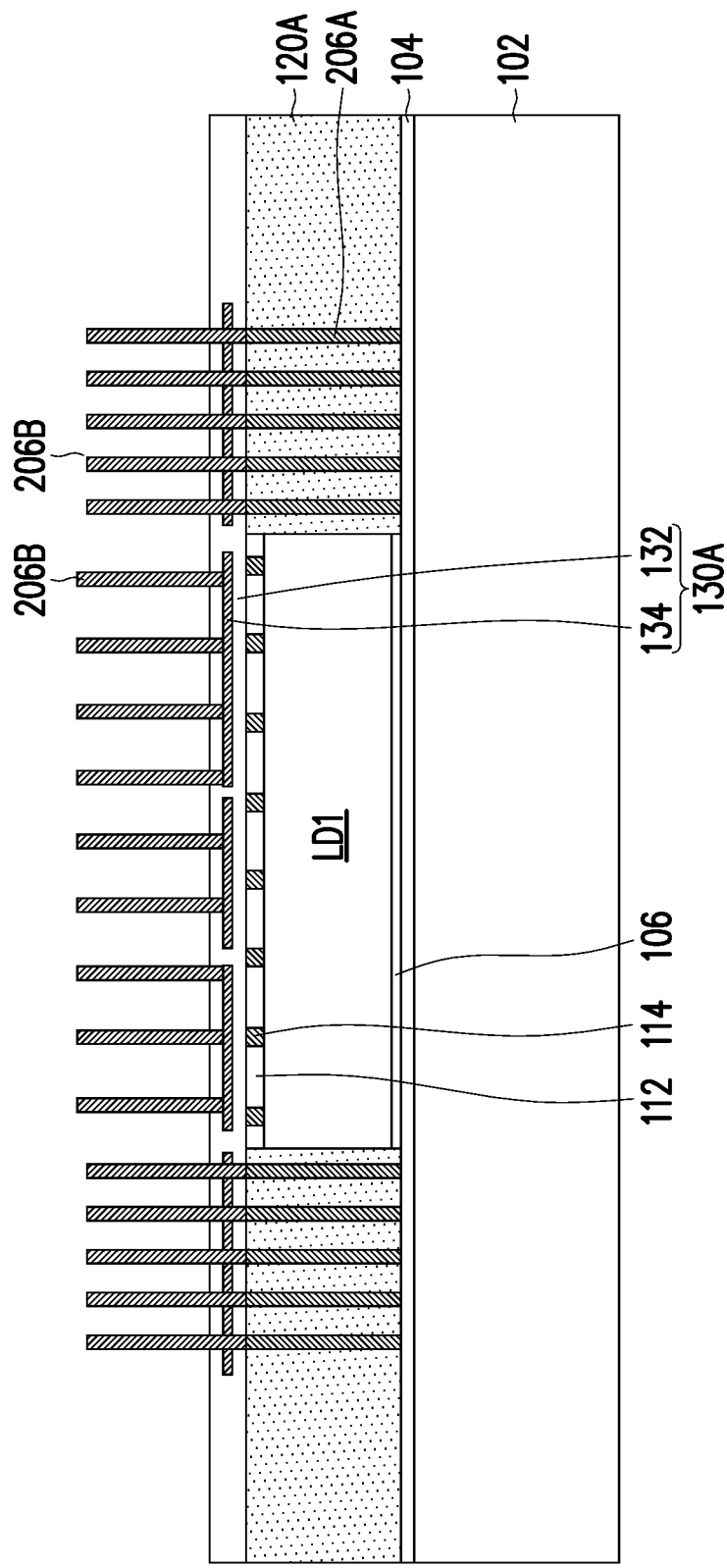

Referring to FIG. 17B, a redistribution layer structure 130A is formed over the encapsulant 120A and electrically connected to the first logic die LD1 and the conductive pillars 206A. Then, a plurality of conductive pillars 206B are formed on and electrically connected to the conductive pillars 206A respectively.

Figure 17C:
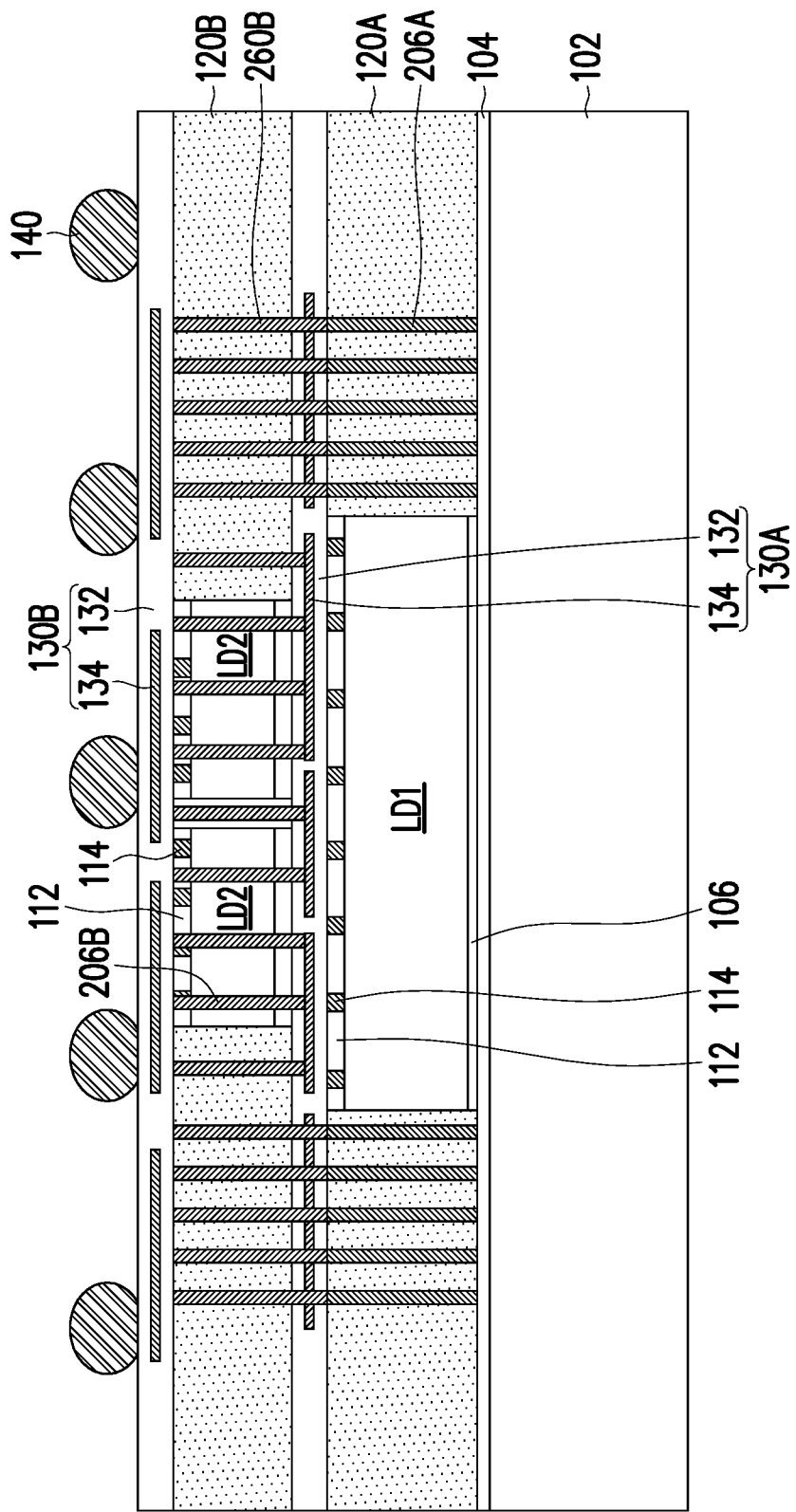

Referring to FIG. 17C, a plurality of second logic dies LD2 are disposed over and electrically connected to the redistribution layer structure 130A. In some embodiments, as shown in FIG. 17C, the second logic dies LD2 are disposed behind the conductive pillars 206B. After that, an encapsulant 120B is formed to encapsulate the second logic dies LD2 and the conductive pillars 206B. Then, a redistribution layer structure 130B is formed over the encapsulant 120B and electrically connected to the second logic dies LD2 and the conductive pillars 206B. After that, a plurality of conductive terminals 140 are formed over and electrically connected to the redistribution layer structure 130B.

Figure 17D:
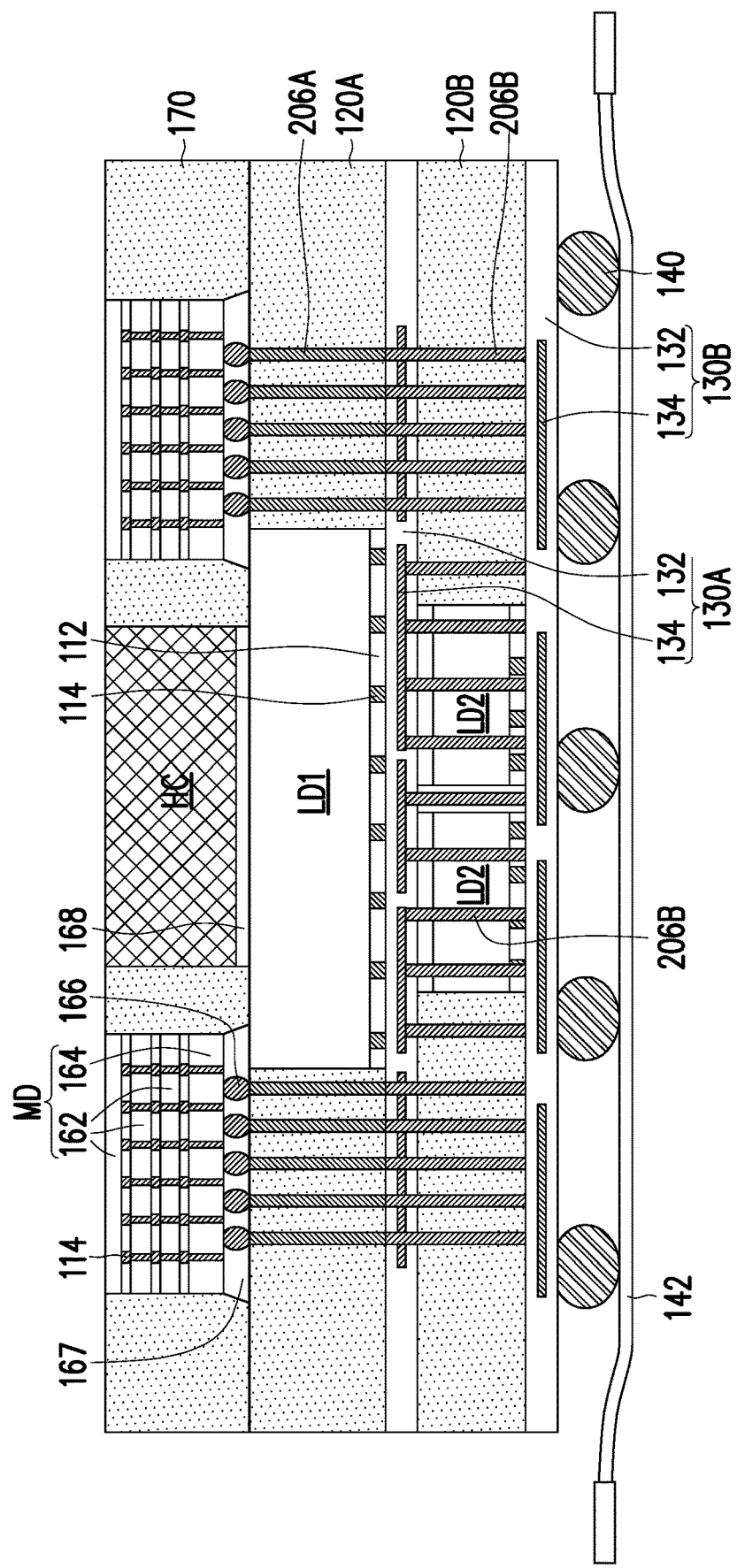

Referring to FIG. 17D, the structure over the de-bonding layer 104 is separated from the carrier 102, and the formed structure is turned upside down and disposed on a carrier 142. After that, the die attach film 106 is removed. Then, as shown in FIG. 18, a plurality of memory dies MD are disposed over the first logic die LD1 and the second logic dies LD2, and the memory dies MD are electrically connected to the conductive pillars 206B. In some embodiments, the memory dies MD are partially overlapped with the first logic die LD1 therebeneath. However, the disclosure is not limited thereto. A plurality of heat conduction blocks HC are disposed between the memory dies MD over the first logic die LD1 and the second logic dies LD2. Then, an encapsulant 170 is formed to encapsulate the memory die MD and the heat conduction blocks HC. After that, a package structure is formed.

Figure 17E:
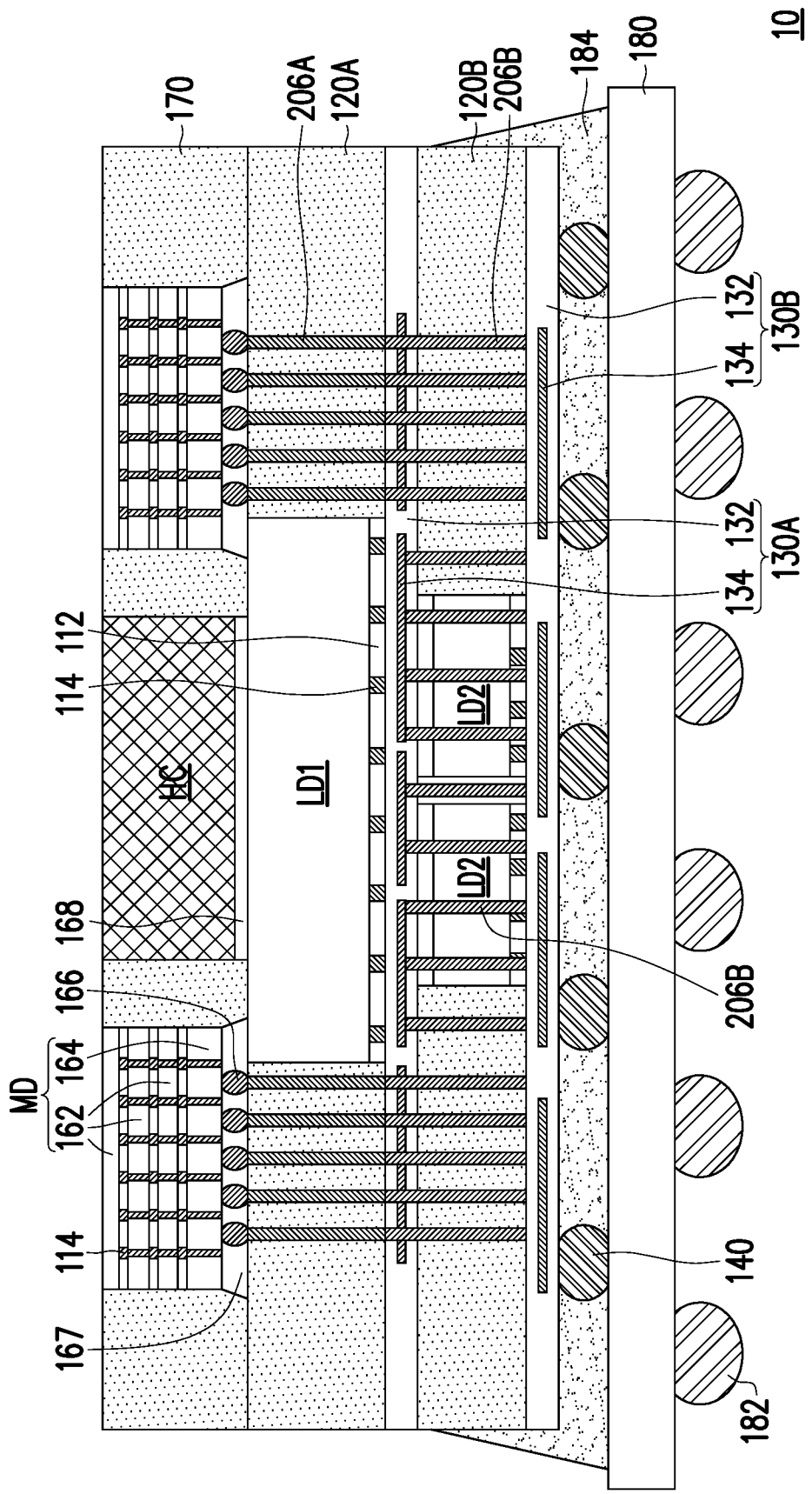

Referring to FIG. 17E, the package structure is de-bonded from the carrier 142 and bonded onto a substrate 180. Then, an underfill 184 is formed aside terminal connectors 182 between the redistribution layer structure 130B and the substrate 180, and a semiconductor package 10 is formed.

Figure 19:
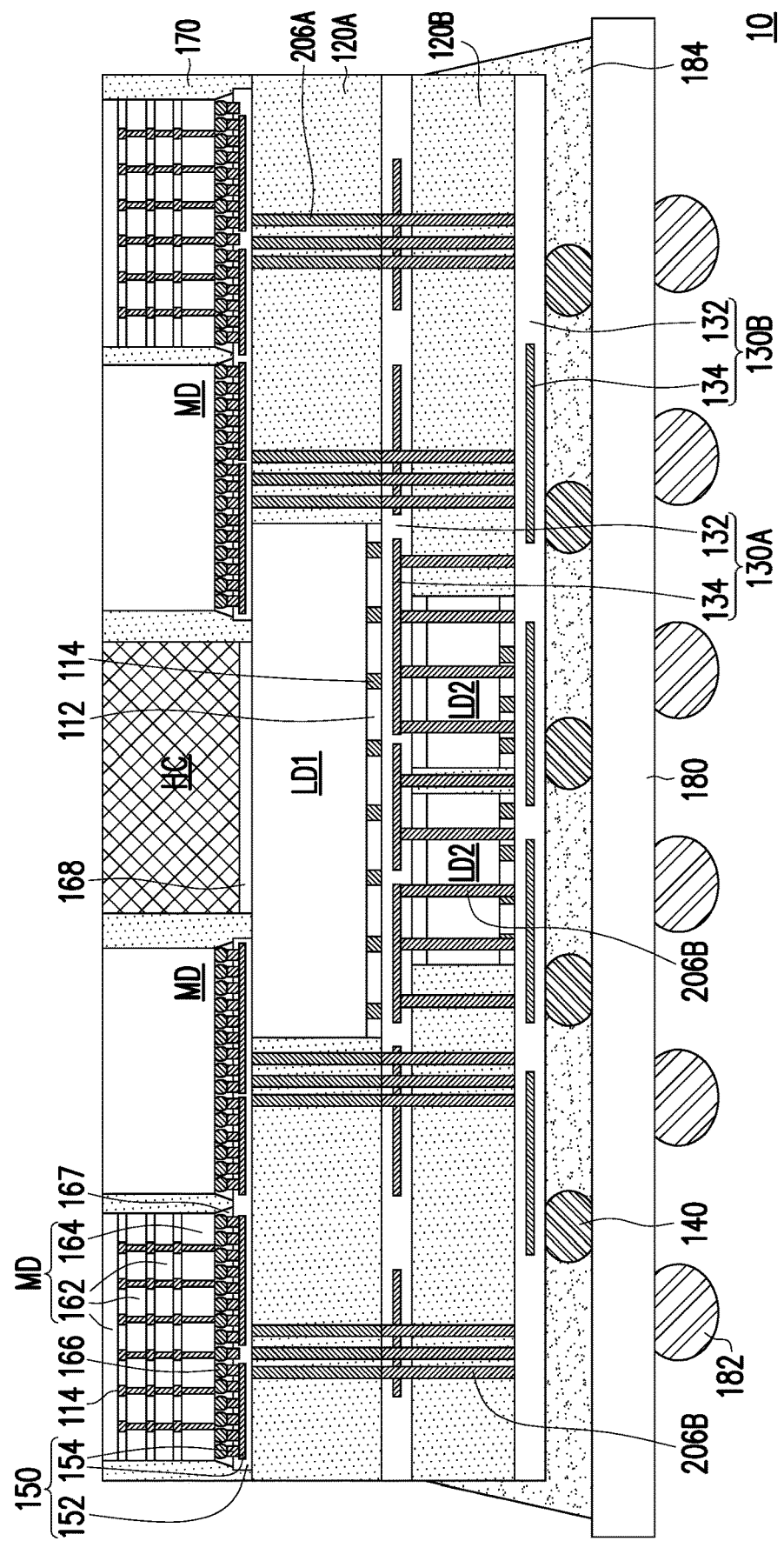
FIG. 19 is a lateral view of a semiconductor package in accordance with some embodiments.

FIG. 19 is a lateral view of a semiconductor package in accordance with some embodiments. The semiconductor package of FIG. 19 may be similar to the semiconductor package of FIG. 17E, and thus the same reference numerals are used to refer to the same and liked parts, and its detailed description will be omitted herein. The difference is illustrated in details below.

In some embodiments, the main difference between the semiconductors 10 of FIGS. 19 and 17E lies in the disposition of the memory dies MD. In some embodiments, the disposition of the memory dies MD is similar to the second layer of the semiconductor package 10 of FIG. 10. In some embodiments, the memory die MD may be electrically connected to the redistribution layer structure 130B through the conductive pillars 206A and 206B and to the first logic die LD1 through the conductive pillars 206A and redistribution layer structure 130A. Thus, the electrical conduction pathway may be shortened.

In some embodiments, a plurality of dies with different sizes and/or technologies are heterogeneous integrated and stacked. Thus, form factor may be reduced. In some embodiments, the bridge is used as the interconnection between logic dies such as core chiplet and I/O die, and the interconnection is shortened. Accordingly, the electrical performance is enhanced. In addition, at least one heat conduction block is disposed aside the dies, and thus the heat generated by the dies may be dissipated efficiently.

According to some embodiments, a semiconductor package includes a substrate and a package structure. The package structure is bonded to the substrate and includes a first redistribution layer structure, a first logic die, a plurality of second logic dies, a first memory die, a first heat conduction block and a first encapsulant. The first logic die and the second logic dies are disposed over and electrically connected to the first redistribution layer structure. The first memory die is disposed over the first logic die and the second logic dies and electrically connected to first redistribution layer structure. The first heat conduction block is disposed over the first logic die and the second logic dies. The first encapsulant encapsulates the first memory die and the first heat conduction block.

According to some embodiments, a semiconductor package includes a package structure. The package structure includes a first logic die, at least one first heat conduction block, a plurality of second logic dies, a first memory die and at least one second heat conduction block. The first heat conduction block is disposed aside the first logic die. The second logic dies are disposed over a first side of the first logic die and electrically connected to the first logic die. The first memory die is disposed over a second side opposite to the first side of the first logic die and electrically connected to the first logic die. The second heat conduction block is disposed aside the first memory die and over the at least one first heat conduction block.

According to some embodiments, a semiconductor package includes a substrate and a package structure. The package structure is bonded to the substrate and includes a first logic die, a plurality of second logic dies, a bridge, at least one first memory die and at least one heat conduction block. The bridge is disposed over a first side of the first and second logic dies, wherein at least two of the first logic die and the second logic dies are electrically connected by the bridge. The first memory die is disposed over a second side opposite to the first side of the first and second logic dies. The heat conduction block is disposed over the second side opposite to the first side of the first and second logic dies.

According to some embodiments, a semiconductor package includes a first die, a first heat conduction block and a first encapsulant. The first die has a bottom surface, a top surface and a sidewall between the bottom surface and the top surface. The first heat conduction block has a bottom surface, a top surface and a sidewall between the bottom surface and the top surface. The first encapsulant is disposed between the sidewall of the first die and the sidewall of the first heat conduction block.

According to some embodiments, a semiconductor package includes a first die and at least one semiconductor block. The first die has a bottom surface, a top surface and a sidewall between the bottom surface and the top surface. The semiconductor block extends along the sidewall of the first die, wherein the at least one semiconductor block is free of active device and passive device.

According to some embodiments, a semiconductor package includes a first die, a semiconductor block and a heat conduction block. The semiconductor block is disposed aside the first die, wherein the at least one semiconductor block is free of active device and passive device. The heat conduction block is adhered to the semiconductor block through an adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first die having a bottom surface, a top surface and a sidewall between the bottom surface and the top surface;
   a silicon block having a bottom surface, a top surface and a sidewall between the bottom surface and the top surface;
   a first encapsulant, disposed between the sidewall of the first die and the sidewall of the silicon block, wherein the top surface of the silicon block is coplanar with a top surface of the first encapsulant; and
   an adhesive adhered to the bottom surface of the silicon block.

2. The semiconductor package as claimed in claim 1, further comprising a second die and a second encapsulant encapsulating the second die and disposed below the first encapsulant.

3. The semiconductor package as claimed in claim 2, further comprising a third die and a third encapsulant encapsulating the third die, wherein the second encapsulant is disposed between the first encapsulant and the third encapsulant.

4. The semiconductor package as claimed in claim 1, wherein the silicon block is free of active device and passive device.

5. The semiconductor package as claimed in claim 1, further comprising a heat conduction block, wherein the silicon block and the heat conduction block are disposed at opposite sides of the first die.

6. The semiconductor package as claimed in claim 1, wherein the top surfaces of the first encapsulant and the silicon block are substantially coplanar with the top surface of the first die.

7. The semiconductor package as claimed in claim 1, wherein a bottom surface of the adhesive is substantially coplanar with the bottom surface of the first die.

8. A semiconductor package, comprising:
   a first die having a bottom surface, a top surface and a sidewall between the bottom surface and the top surface;
   at least one semiconductor block comprising a semiconductor material, extending along the sidewall of the first die, wherein the at least one semiconductor block is free of active device and passive device;
   an encapsulant, wherein the encapsulant encapsulates opposite sidewalls of the at least one semiconductor block; and
   an adhesive adhered to a bottom surface of the at least one semiconductor block.

9. The semiconductor package as claimed in claim 8, wherein the at least one semiconductor block includes a plurality of semiconductor blocks, and the semiconductor blocks are disposed at opposite sides of the first die.

10. The semiconductor package as claimed in claim 8, wherein the opposite sidewalls of the at least one semiconductor block are flush with opposite sidewalls of the adhesive.

11. The semiconductor package as claimed in claim 8, wherein a top surface of the at least one semiconductor block is substantially coplanar with the top surface of the first die.

12. The semiconductor package as claimed in claim 8, wherein the encapsulant further encapsulates the first die, and the encapsulant is in direct contact with the opposite sidewalls of the at least one semiconductor block.

13. The semiconductor package as claimed in claim 8, further comprising a second die, a first redistribution layer structure, a second redistribution layer structure and a plurality of through vias, wherein the first redistribution layer structure is disposed between the first die and the second die, the second die is disposed between the first die and the second redistribution layer structure, and the through vias are disposed between the first redistribution layer structure and the second redistribution layer structure.

14. A semiconductor package, comprising:
    a first die;
    a semiconductor block, disposed aside the first die, wherein the at least one semiconductor block is free of active device and passive device; and
    a heat conduction block, adhered to the semiconductor block through an adhesive.

15. The semiconductor package as claimed in claim 14, wherein the heat conduction block includes a semiconductor material, a conductive material or a combination thereof.

16. The semiconductor package as claimed in claim 14, further comprising a dielectric layer between the semiconductor block and the adhesive.

17. The semiconductor package as claimed in claim 14, further comprising a second die, wherein the heat conduction block is disposed aside the second die below the first die and the semiconductor block.

18. The semiconductor package as claimed in claim 14, wherein the semiconductor block and the first die are encapsulated by a first encapsulant, and the heat conduction block is encapsulated by a second encapsulant.

19. The semiconductor package as claimed in claim 14, wherein a surface of the first die is substantially coplanar with a surface of the semiconductor block.

20. The semiconductor package as claimed in claim 14, wherein a sidewall of the adhesive is substantially flush with one of sidewalls of the semiconductor block and the heat conduction block.

* * * * *